United States Patent
Jones et al.

(10) Patent No.: US 6,384,616 B1
(45) Date of Patent: May 7, 2002

(54) PACKAGING AND INTERCONNECTION OF CONTACT STRUCTURE

(75) Inventors: Mark R. Jones, Mundelein; Theodore A. Khoury, Chicago, both of IL (US)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/929,533

(22) Filed: Aug. 13, 2001

Related U.S. Application Data

(63) Continuation of application No. 09/282,506, filed on Mar. 31, 1999.

(51) Int. Cl.$^7$ .............................................. G01R 31/02
(52) U.S. Cl. ...................... 324/754; 324/762; 257/692; 257/696
(58) Field of Search ................................. 324/754, 757, 324/761, 762, 158.1; 257/48, 669, 673, 690, 692, 696, 700, 778, 780, 784; 361/736, 737, 743, 746, 760, 761, 820

(56) References Cited

U.S. PATENT DOCUMENTS

| | | | | |
|---|---|---|---|---|
| 3,911,361 A | * | 10/1975 | Bove et al. | 324/761 |
| 5,772,451 A | * | 6/1998 | Dozier, II et al. | 439/70 |
| 6,023,103 A | * | 2/2000 | Chang et al. | 257/781 |
| 6,031,282 A | * | 2/2000 | Jones et al. | 257/692 |
| 6,184,576 B1 | * | 2/2001 | Jones et al. | 257/696 |

* cited by examiner

Primary Examiner—Ernest Karlsen
Assistant Examiner—Minh N. Tang
(74) Attorney, Agent, or Firm—Muramatsu & Associates

(57) ABSTRACT

A packaging and interconnection for connecting a contact structure to an outer peripheral component. The packaging and interconnection includes a contact structure made of conductive material and formed on a contact substrate, a contact trace formed on the contact substrate and connected to the contact structure, a contact pad formed on a bottom surface of the contact substrate and connected to the contact structure through a via hole and the contact trace, a contact target provided at an outer periphery of the contact structure to be electrically connected with the contact pad, and a conductive member for connecting the contact pad and the contact target.

14 Claims, 19 Drawing Sheets

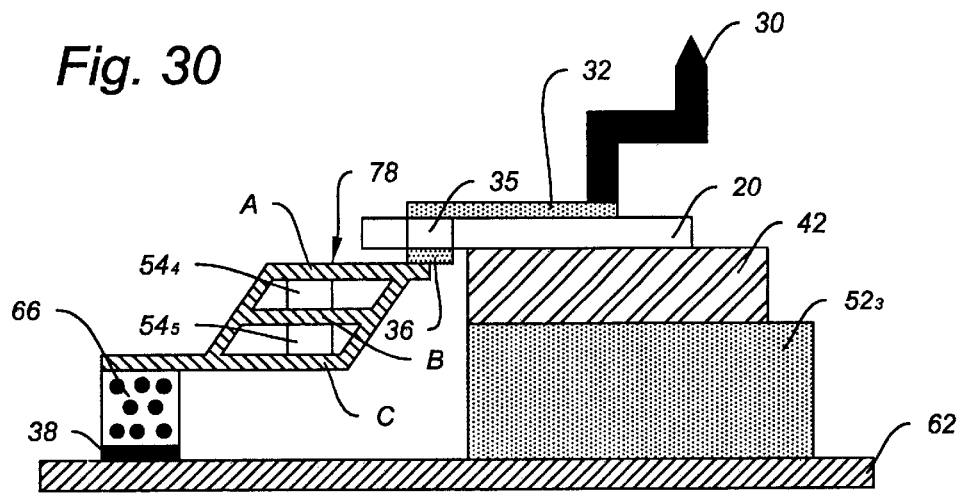
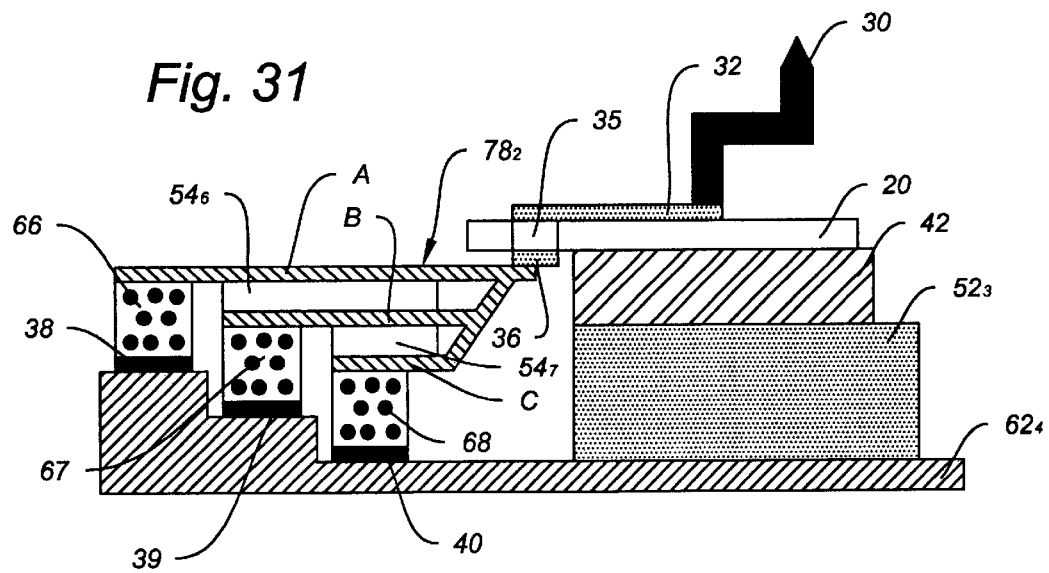

PACKAGING AND INTERCONNECTION OF CONTACT STRUCTURE

This is a continuation of U.S. patent application No. 09/282,506 filed Mar. 31, 1999.

FIELD OF THE INVENTION

This invention relates to an electronic packaging and interconnection of a contact structure, and more particularly, to an electronic packaging and interconnection for mounting a contact structure on a probe card or equivalent thereof which is used to test semiconductor wafers, semiconductor chips, packaged semiconductor devices or printed circuit boards and the like with increased accuracy, density and speed.

BACKGROUND OF THE INVENTION

In testing high density and high speed electrical devices such as LSI and VLSI circuits, high performance probe contactors or test contactors must be used. The electronic packaging and interconnection of a contact structure of the present invention is directed to the application of testing and burn-in testing of semiconductor wafers and dies, but not limited to such applications and is inclusive of testing and burn-in test of packaged semiconductor devices, printed circuit boards and the like. However, for the convenience of explanation, the present invention is described in the following mainly with reference to a probe card to be used in semiconductor wafer testing.

In the case where semiconductor devices to be tested are in the form of a semiconductor wafer, a semiconductor test system such as an IC tester is usually connected to a substrate handler, such as an automatic wafer prober, to automatically test the semiconductor wafer. Such an example is shown in FIG. 1 in which a semiconductor test system has a test head 100 which is ordinarily in a separate housing and electrically connected to the test system through a bundle of cables. The test head 100 and the substrate handler 400 are mechanically connected with one another by means of a manipulator 500 and a drive motor 510. The semiconductor wafers to be tested are automatically provided to a test position of the test head by the substrate handler such as a wafer prober.

On the test head, the semiconductor wafer to be tested is provided with test signals generated by the semiconductor test system. The resultant output signals from the semiconductor wafer under test are transmitted to the semiconductor test system wherein they are compared with expected data to determine whether IC circuits (chips) on the semiconductor wafer function correctly or not.

As shown in FIGS. 1 and 2, a test head 100 and a substrate handler 400 are connected with each other through an interface component 140. The interface component 140 includes a performance board 120 which is typically a printed circuit board having electric circuit connections unique to a test head's electrical footprint, such as coaxial cables, pogo-pins and connectors. The test head 100 includes a large number of printed circuit boards 150 which correspond to the number of test channels (tester pins) of the semiconductor test system. Each of the printed circuit boards 150 has a connector 160 to receive therein a corresponding contact terminal 121 of the performance board 120.

In the example of FIG. 2, a "frog" ring 130 is mounted on the performance board 120 to accurately determine the contact positions relative to the substrate handler 400 such as a wafer prober. The frog ring 130 has a large number of contact pins 141 formed, for example, by ZIF connectors or pogo-pins, connected to the contact terminals 121, through coaxial cables 124.

FIG. 2 further shows a structural relationship between the substrate handler 400, the test head 100 and the interface component 140 when testing a semiconductor wafer. As shown in FIG. 2, the test head 100 is placed over the substrate handler 400 and mechanically and electrically connected to the substrate handler through the interface component 140. In the substrate handler 400, a semiconductor wafer 300 to be tested is mounted on a chuck 180. A probe card 170 is provided above the semiconductor wafer 300 to be tested. The probe card 170 has a large number of probe contactors (contact structures) 190, such as cantilevers or needles, to contact with circuit terminals or contact targets or contact pads in the IC circuit of the semiconductor wafer 300 under test.

Electrical terminals or contact receptacles of the probe card 170 are electrically connected to the contact pins 141 provided on the frog ring 130. The contact pins 141 are also connected to the contact terminals 121 of the performance board 120 via the coaxial cables 124 where each contact terminal 121 is connected to the printed circuit board 150 of the test head 100. Further, the printed circuit boards 150 are connected to the semiconductor test system main frame through the cable bundle 110 having several hundreds of cables therein.

Under this arrangement, the probe contactors (needles or cantilevers) 190 contact the surface of the semiconductor wafer 300 on the chuck 180 to apply test signals to the IC chips on the semiconductor wafer 300 and receive the resultant signals of the IC chips from the wafer 300. The resultant output signals from the semiconductor wafer 300 under test are compared with the expected data generated by the semiconductor test system to determine whether the IC chips in the semiconductor wafer 300 properly perform the intended functions.

FIG. 3 is a bottom view of the probe card 170 of FIG. 2. In this example, the probe card 170 has an epoxy ring on which a plurality of probe contactors 190 called needles or cantilevers are mounted. When the chuck 180 mounting the semiconductor wafer 300 moves upward in FIG. 2, the tips of the cantilevers 190 contact the contact targets such as contact pads or bumps on the wafer 300. The ends of the cantilevers 190 are connected to wires 194 which are further connected to transmission lines (not shown) formed in the probe card 170. The transmission lines in the probe card 170 are connected to a plurality of electrodes 197 which further contact the pogo pins 141 of FIG. 2.

Typically, the probe card 170 is structured by a multilayer of polyimide substrates having ground planes, power planes, signal transmission lines in many layers. As is well known in the art, each of the signal transmission lines is designed to have a characteristic impedance such as 50 ohms by balancing the distributed parameters, i.e., dielectric constant and magnetic permeability of the polyimide, inductances and capacitances of the signal paths within the probe card 170. Thus, the signal transmission lines are impedance matched to achieve a high frequency transmission bandwidth to the wafer 300 under test. The signal transmission lines transmit a small current during a steady state of a pulse signal and a large peak current during a transition state of the device's outputs switching. For removing noise, capacitors 193 and 195 are provided on the probe card 170 between the power and ground planes.

An equivalent circuit of the probe card 170 is shown in FIGS. 4A–4E to explain the limitations of bandwidth in the conventional probe card technology. As shown in FIGS. 4A and 4B, the signal transmission line on the probe card 170 extends from the electrode 197, the strip line (impedance matched line) 196, the wire 194 and to the needle (cantilever) 190. Since the wire 194 and needle 190 are not impedance matched, these portions function as an inductor L in the high frequency band as shown in FIG. 4C. Because of the overall length of the wire 194 and needle 190 is around 20–30 mm, the value of the inductor L is not trivial, resulting in the significant frequency limitation in testing a high frequency performance of a device under test.

Other factors which limit the frequency bandwidth in the probe card 170 reside in both power and ground needles shown in FIGS. 4D and 4E. If a power line can provide large enough currents to the device under test, it will not seriously limit the operational bandwidth in testing the device. However, because the series connected wire 194 and needle 190 for supplying the power to the device under test are equivalent to the inductors as shown in FIG. 4D, which impede the high speed current flow in the power line. Similarly, because the series connected wire 194 and needle 190 for grounding the power and signals are equivalent to the inductors as shown in FIG. 4E, the high speed current flow is impeded by the wire 194 and needle 190.

Moreover, the capacitors 193 and 195 are provided between the power line and the ground line to secure a proper performance of the device under test by filtering out the noise or surge pulses on the power lines. The capacitors 193 have a relatively large value such as 10 $\mu$F and can be disconnected from the power lines by switches if necessary. The capacitors 195 have a relatively small capacitance value such as 0.01 $\mu$F and fixedly connected close to the DUT (device under test). Since these capacitors serve as high frequency decoupling on the power lines, which also impede the high speed current flow in the signal and power lines.

Accordingly, the probe contactors noted above are limited to the frequency bandwidth of approximately 200 MHz which is insufficient to test recent semiconductor devices. It is considered, in the industry, that the frequency bandwidth equal to the tester's capability, which is currently on the order of 1 GHz or higher, will be necessary in the near future. Further, it is desired in the industry that a probe card is capable of handling a large number of semiconductor devices, especially memory devices, such as 32 or more, in a parallel fashion at the same time to increase test throughput.

To meet the next generation test requirements noted above, the inventors of this application has provided a new concept of contact structure in the U.S. application Ser. No. 09/099,614 "Probe Contactor Formed by Photolithography Process" filed Jun. 19, 1998. The contact structure is formed on a silicon or dielectric substrate through a photolithography process. FIGS. 5 and 6A–6C show the contact structure in the above noted application. In FIG. 5, all of the contact structures 30 are formed on a silicon substrate 20 through the same photolithography process. The silicon substrate 20 having the contact structures 30 may be mounted on a probe card such as shown in FIGS. 2 and 3. When the semiconductor wafer 300 under test moves upward, the contact structures 30 contact with corresponding contact targets (electrodes or pads) 320 on the wafer 300.

The contact structure 30 on the silicon substrate 20 can be directly mounted on a probe card such as shown in FIG. 3, or molded in a package, such as a traditional IC package having leads, so that the package is mounted on a probe card. In the above noted patent application by the inventors, such technologies of packaging and interconnection of the contact structure 30 with respect to the probe card or equivalent thereof is not described.

SUMMARY OF THE INVENTION

Therefore, it is an object of the present invention to provide a packaging and interconnection of a contact structure with respect to a probe card or equivalent thereof to be used in testing a semiconductor wafer, packaged LSI and the like.

It is another object of the present invention to provide a packaging and interconnection of a contact structure with respect to a probe card or equivalent thereof to achieve a high speed and high frequency operation in testing a semiconductor wafer, packaged LSI and the like.

It is a further object of the present invention to provide a packaging and interconnection of a contact structure with respect to a probe card or equivalent thereof wherein the packaging and interconnection is formed at a bottom surface of the substrate mounting the contact structure.

It is a further object of the present invention to provide a packaging and interconnection of a contact structure which is established through a bonding wire, a single layer tape automated bonding (TAB), or a multi-layer tape automated bonding (TAB) at the bottom surface of the substrate mounting the contact structure.

It is a further object of the present invention to provide a packaging and interconnection of a contact structure which is established between a contact pad formed at the bottom surface of the substrate mounting the contact structure and an electric connector.

It is a further object of the present invention to provide a packaging and interconnection of a contact structure which is established between a contact pad formed at the bottom surface of the substrate mounting the contact structure and an interconnect pad of a printed circuit board through a solder bump.

It is a further object of the present invention to provide a packaging and interconnection of a contact structure which is established between a contact pad formed at the bottom surface of the substrate mounting the contact structure and an interconnect pad of a printed circuit board through a conductive polymer.

In the present invention, an electronic packaging and interconnection of a contact structure to be used in a probe card or equivalent thereof to test semiconductor wafers, semiconductor chips, packaged semiconductor devices or printed circuit boards and the like is established between a contact pad formed at the bottom surface of the substrate mounting the contact structure and various types of connection means on the probe card. The contact pad at the bottom is connected to the contact structure at an upper surface of the substrate through a via hole and a contact trace both of which are provided on the substrate.

In one aspect of the present invention, a packaging and interconnection of a contact structure is comprised of: a contact structure made of conductive material and formed on a contact substrate through a photolithography process wherein the contact structure has a base portion vertically formed on the contact substrate, a horizontal portion, one end of which being formed on the base portion, and a contact portion vertically formed on another end of the horizontal portion; a contact pad formed on a bottom surface of the contact substrate and electrically connected to the contact structure through a via hole and a contact trace; a contact target provided on a printed circuit board (PCB) substrate to be electrically connected with the contact pad on the contact substrate through a conductive bump or polymer.

In another aspect of the present invention, a packaging and interconnection of a contact structure is comprised of: a contact structure made of conductive material and formed on a contact substrate through a photolithography process wherein the contact structure has a base portion vertically formed on the contact substrate, a horizontal portion, one end of which being formed on the base portion, and a contact portion vertically formed on another end of the horizontal portion; a contact pad formed on a bottom surface of the contact substrate and electrically connected to the contact structure through a via hole and a contact trace; a contact target provided on a printed circuit board (PCB) substrate or lead frame to be electrically connected with the contact pad on the contact substrate through a bonding wire; and a support structure for supporting the contact structure and the contact substrate.

In a further aspect of the present invention, a packaging and interconnection of a contact structure is comprised of: a contact structure made of conductive material and formed on a contact substrate through a photolithography process wherein the contact structure has a base portion vertically formed on the contact substrate, a horizontal portion, one end of which being formed on the base portion, and a contact portion vertically formed on another end of the horizontal portion; a contact pad formed on a bottom surface of the contact substrate and electrically connected to the contact structure through a via hole and a contact trace; a contact target provided on a printed circuit board (PCB) substrate or lead frame to be electrically connected with the contact pad on the contact substrate through a tape automated bonding (TAB) lead; an elastomer provided under the contact substrate for allowing flexibility in the interconnection and packaging; and a support structure for supporting the contact structure, the contact substrate and the elastomer.

In a further aspect of the present invention, a connector is provided to receive the TAB lead connected to the contact pad to establish electrical connection therebetween. In a further aspect of the present invention, a conductive bump is provided between the TAB lead connected to the contact pad and the PCB pad to establish electrical connection thereamong. In a further aspect of the present invention, a conductive polymer is provided between the TAB lead connected to the contact pad and the PCB pad to establish electrical connection thereamong.

In a further aspect of the present invention, the interconnection and packaging of the contact structure is established through a bonding wire between the contact pad on the contact substrate and a contact target. In a further aspect of the present invention, the interconnection and packaging of the contact structure is established through a single layer TAB lead extending between the contact pad on the contact substrate and a contact target. In a further aspect of the present invention, the interconnection and packaging of the contact structure is established through a double layer TAB lead extending between the contact pad on the contact substrate and a contact target. In a further aspect of the present invention, the interconnection and packaging of the contact structure is established through a triple layer TAB lead extending between the contact pad on the contact substrate and a contact target.

According to the present invention, the packaging and interconnection has a very high frequency bandwidth to meet the test requirements in the next generation semiconductor test technology. The packaging and interconnection is able to mount the contact structure on a probe card or equivalent thereof by electrically connecting therewith through the bottom surface of the contact substrate mounting the contact structure. Moreover, because of the relatively small number of overall components to be assembled, the interconnection and packaging of the present invention can be fabricated with low cost and high reliability as well as high productivity.

BRIEF DESCRIPTION OF THE DRAWINGS

FIG. 30 is a schematic diagram showing a further modified structure of the fifth embodiment of the present invention in which a conductive polymer is incorporated between the triple layer TAB lead and the contact target as one of interconnection and packaging members.

FIG. 31 is a schematic diagram showing a further modified structure of the fifth embodiment of the present invention in which three conductive polymer are incorporated between the triple layer TAB lead and the contact targets as interconnection and packaging members.

DETAILED DESCRIPTION OF THE PREFERRED EMBODIMENT

Figure 6A:
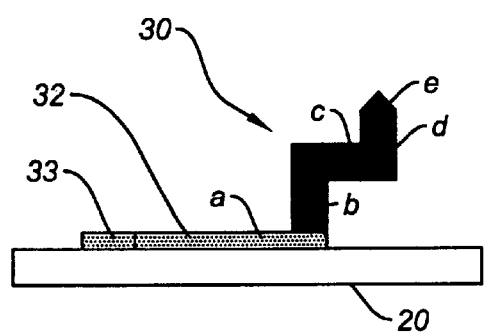
FIGS. 6A–6C are schematic diagrams showing examples of contact structure associated with the present invention formed on a silicon substrate.
Figure 6B:
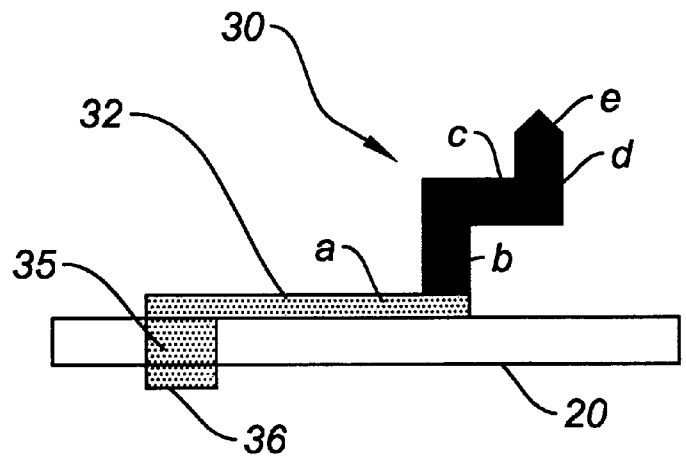
Figure 6C:
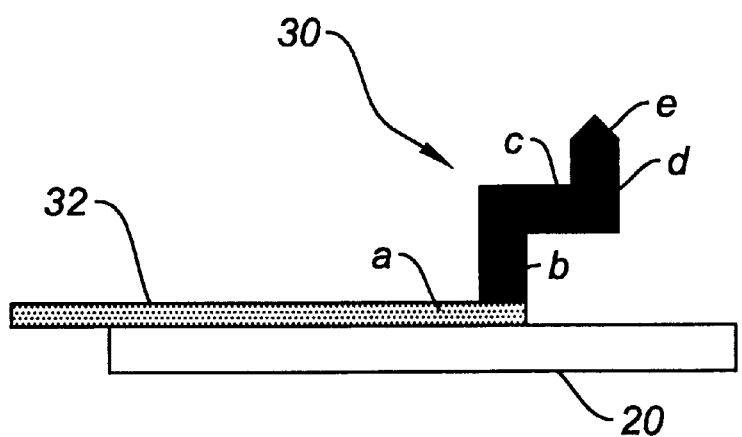

To establish a packaging and interconnection of a contact structure directly with a probe card or indirectly with a probe card through an IC package, examples of FIGS. 6A–6C show basic three types of electrical path extended from the contact structure to form such interconnections. FIG. 6A shows an example in which such an electrical connection is established at the top of the substrate. FIG. 6B shows an example in which an electrical connection is established at the bottom of the substrate while FIG. 6C shows an example in which an electrical connection is formed at the edge of the substrate. Almost any types of existing IC package design or probe card design can accommodate at least one of the interconnect types of FIGS. 6A–6C.

Figure 3:
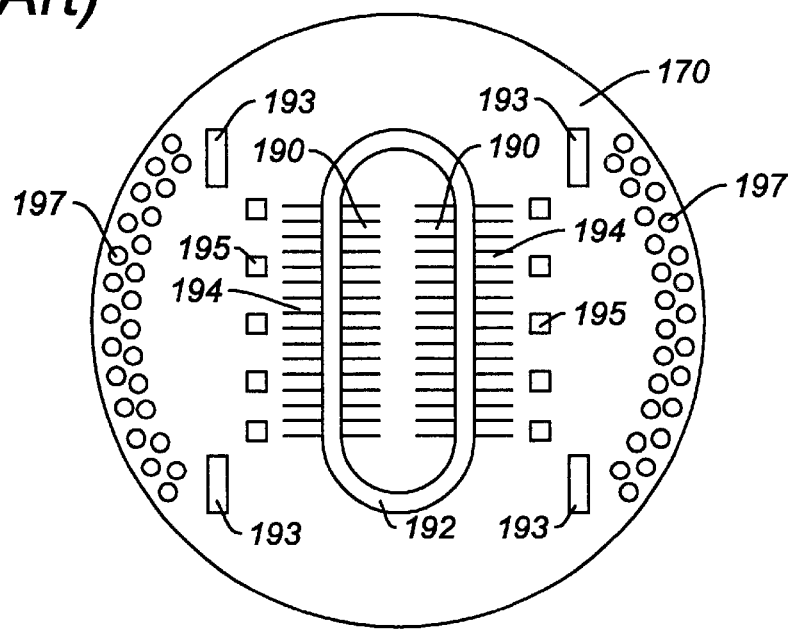
FIG. 3 is a bottom view showing an example of the probe card having an epoxy ring for mounting a plurality of cantilevers as probe contactors.
Figure 4A:
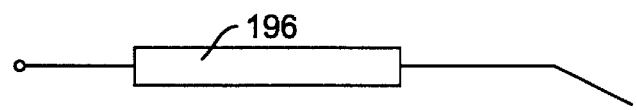
FIGS. 4A–4E are circuit diagrams showing equivalent circuits of the probe card of FIG. 3.
Figure 4B:
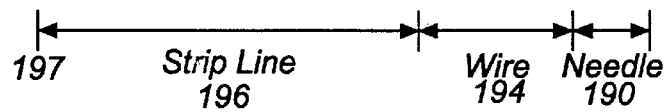
Figure 4C:
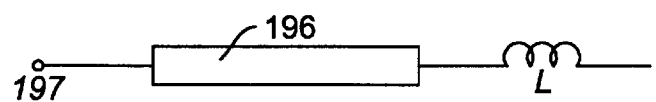
Figure 4D:
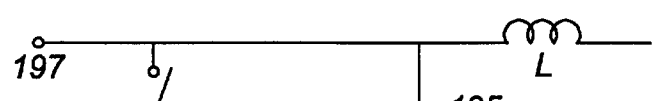
Figure 4E:
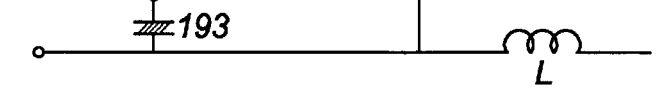
Figure 5:
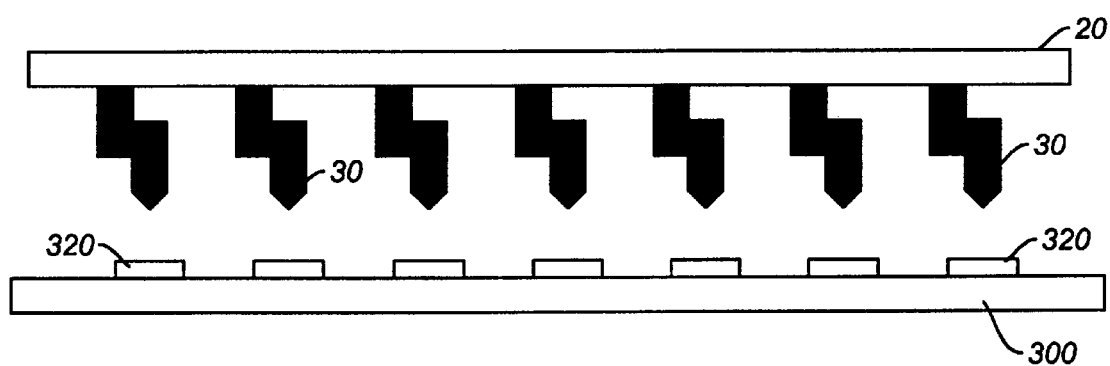
FIG. 5 is a schematic diagram showing contact structures associated with the present invention produced through a photolithography process.

Each of FIGS. 6A–6C include a contact interconnect trace 32 also designated by a which is to establish electrical connection with a probe card or any intermediate member to a probe card. The contact structure 30 has vertical portions b and d and a horizontal beam c and a tip portion e. The tip portion e of the contact structure 30 is preferably sharpened to achieve a scrubbing effect when pressed against contact targets 320 such as shown in FIG. 3. The spring force of the horizontal beam c provides an appropriate contact force against the contact target 320. An example of material of the contact structure 30 and the contact trace 32 includes nickel, aluminum, copper and other conductive materials. The inventors of this application have provided a detailed description of production process of the contact structure 30 and the contact interconnect trace 32 on the silicon substrate 20 in the above noted U.S. application Ser. No. 09/099,614.

In the present invention, the packaging and interconnection of a contact structure is directed to the type of structure having a contact pad 36 provided at a bottom surface of the substrate 20, i.e., the bottom type contact pad as shown in FIG. 6B. The contact pad 36 is connected to the contact structure 30 through a via hole 35 and the contact trace 32. The contact structure 30 is formed on the top surface of the contact substrate 20. Various embodiments of the present invention on the bottom type packaging and interconnection will be described with reference to the drawings.

Figure 7:
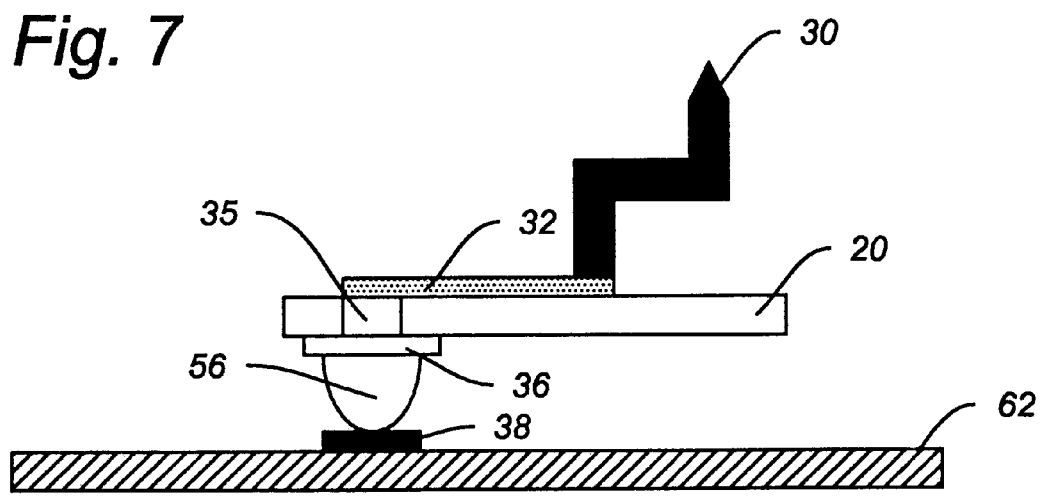
FIG. 7 is a schematic diagram showing a first embodiment of the present invention in which the packaging and interconnection is established between a contact pad provided at a bottom surface of the contact substrate mounting the contact structure and a PCB (printed circuit board) pad by a conductive bump.

FIG. 7 is a schematic diagram showing a first embodiment of the present invention in which the packaging and interconnection is established between the contact pad provided at the bottom surface of the contact substrate mounting the contact structure and a connection target such as a PCB (printed circuit board) pad through a conductive bump or a conductive polymer.

In the first example of FIG. 7, a contact structure 30 formed on a contact substrate 20 is electrically connected to a contact pad 36 provided at the bottom surface of the contact substrate 20 through a contact trace 32 and a via hole 35. The contact structure 30 is formed on the top surface of the contact substrate 20. The contact pad 36 at the bottom of the contact substrate 20 is positioned over a print circuit board (PCB) interconnect pad 38 on a printed circuit board (PCB) 62. A conductive bump 56 electrically connects the contact pad and the PCB pad. The contact substrate 20 is a silicon substrate although other types of dielectric substrate, such as glass epoxy, polyimide, ceramic, and alumina substrates are also feasible.

Typically, the conductive bump 56 is a solder bump used in a standard solder ball technology. By the application of the heat, the conductive bump 56 is reflowed onto the PCB pad 38 for attachment between the contact pad 36 and the PCB pad 38. Another example of the conductive bump 56 is a fluxless solder ball used in a plasma-assisted dry soldering technology. Further examples of conductive bump will be given later with respect to further embodiments of the present invention.

Figure 8:
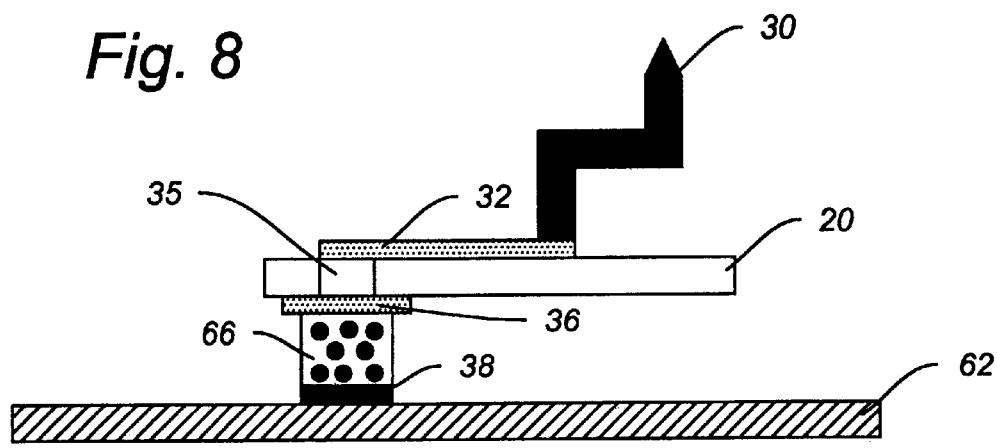
FIG. 8 is a schematic diagram showing a modified structure of the first embodiment of the present invention wherein a conductive polymer is used between the contact pad and the PCB pad.

In the example of FIG. 8, a conductive polymer 66 is used between the contact pad 36 provided at the bottom surface of the contact substrate 20 and the PCB pad 38 (connection target) on the PCB substrate 62. The contact substrate 20 is a silicon substrate although other types of dielectric substrate, such as glass epoxy, polyimide, ceramic, and alumina substrates are also feasible. An example of the conductive polymer 66 is a conductive elastomer which is filled with conductive wire that extends beyond the surface of the elastomer. Most conductive polymers are designed to be conductive between the mating electrodes normally in vertical or angled directions and not conductive in the horizontal direction. Further examples of conductive polymer will be given later with respect to further embodiments of the present invention.

Figure 9:
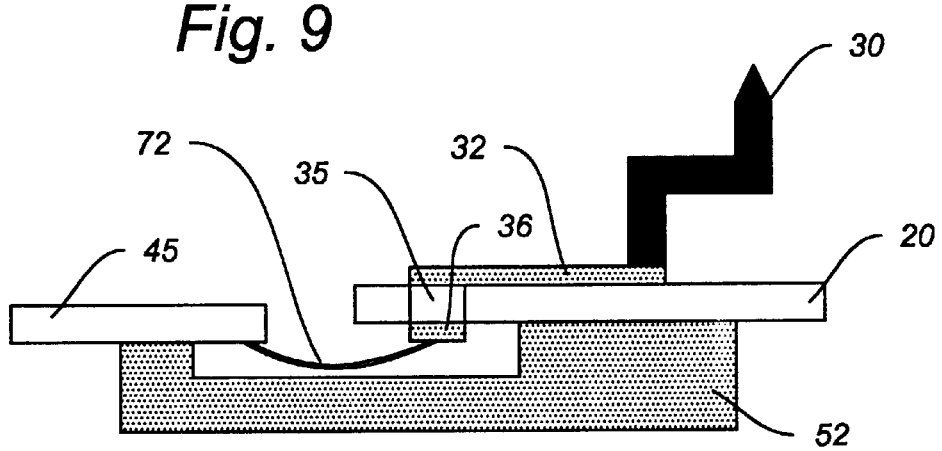
FIG. 9 is a schematic diagram showing a second embodiment of the present invention in which the packaging and interconnection is established by a bonding wire between a contact pad provided at a bottom surface of the contact substrate mounting the contact structure and a contact target provided on a probe card or a device package.
Figure 10:
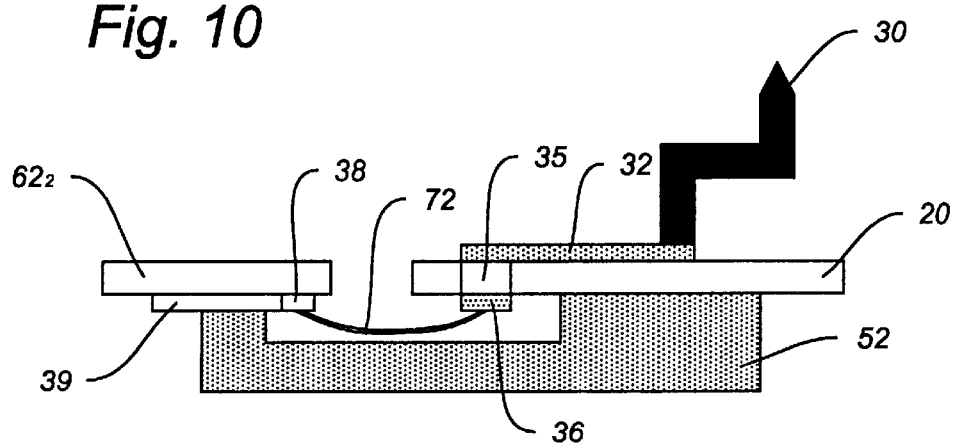
FIG. 10 is a schematic diagram showing a modified structure of the second embodiment of the present invention wherein the contact target is a PCB pad.
Figure 11:
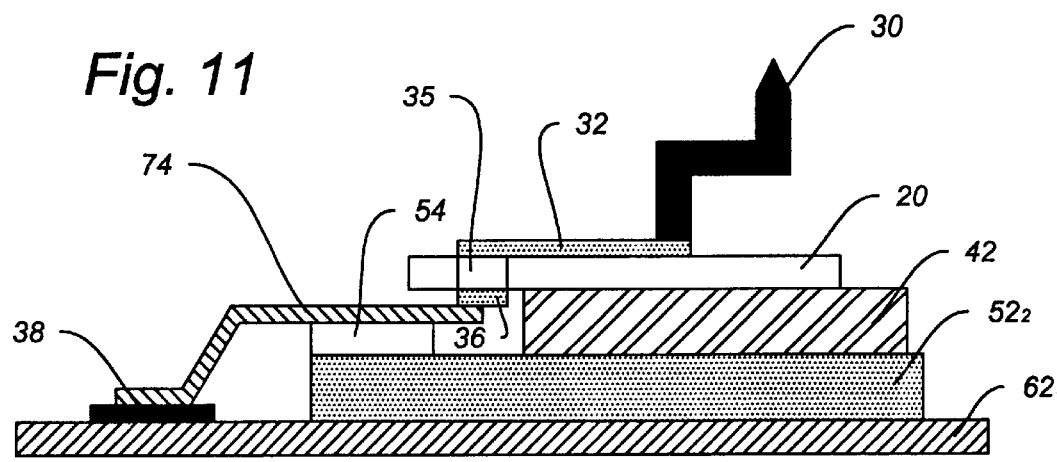
FIG. 11 is a schematic diagram showing a third embodiment of the present invention in which the packaging and interconnection is established by a single layer TAB (tape automated bonding) lead between a contact pad provided at a bottom surface of the contact substrate mounting the contact structure and a contact target on a probe card or a device package.

FIGS. 9 and 10 show a second embodiment of the present invention wherein the bottom type contact pad is coupled to a connection target such as a lead frame or a printed circuit board provided, for example, on a probe card (not shown) or an IC package (not shown) through a bonding wire. In the first example of FIG. 9, a contact structure 30 formed on a contact substrate 20 is electrically connected to a contact pad 36 provided at the bottom surface of the contact substrate 20 via a contact trace 32 and a through hole 35. The contact structure 30 is formed on the top surface of the contact substrate 20. The contact pad 36 is designed to establish an electrical connection with contact or connection targets such as a lead frame 45 through various contact means such as a bonding wire 72. The bonding wire 72 is a thin wire of 15–25 μm diameter and made, for example, of gold or aluminum.

Typically, the contact substrate 20 is a silicon substrate although other types of dielectric substrate, such as glass epoxy, polyimide, ceramic, and alumina substrates are also feasible. In the example of FIG. 9, the bonding wire 72 connects the contact pad 36 and the lead frame 45 of, for example, a probe card. The contact substrate 20 and the lead frame 45 are mounted on a support structure 52 through, for example, an adhesive (not shown).

Any wire bonding procedure can be used to establish the connection between the contact pad 36 and the contact target. The bonding wire 72 is first bonded to the contact pad 36 of the contact substrate and spanned to the lead frame 45. The wire 72 is bonded to the lead frame 45 and is clipped, and the entire process above is repeated at the next bonding location. The wire bonding is done with either gold or aluminum wires. Both materials are highly conductive and ductile enough to withstand deformation during the bonding steps and still remaining strong and reliable. In the gold wire bonding, thermo-compression (TC) and thermosonic methods are typically used. In the aluminum wire bonding, ultrasonic and wedge bonding methods are typically used.

In the example of FIG. 10, the contact pad 36 at the bottom of the contact substrate is connected to a printed circuit board (PCB) interconnect pad 38 provided on a PCB substrate $62_2$ through a bonding wire 72. The PCB substrate $62_2$ can be a probe card such as shown in FIG. 3 or an intermediate circuit component provided between the contact structure and the probe card. The PCB substrate is mounted on a support structure 52. The contact substrate 20 and the support structure 52 are fixed with one another by, for example, an adhesive (not shown). Similarly, the PCB substrate $62_2$ and the support structure 52 are fixed with one another by an adhesive (not shown)

FIGS. 11–15 show a third embodiment of the present invention wherein the bottom type contact pad is coupled to a contact target through a single layer lead formed by a tape automated bonding (TAB) process. In the first example of FIG. 11, the contact structure 30 formed on a top surface of the contact substrate 20 is electrically connected to the contact pad 36 at the bottom of the substrate 20 via the contact trace 32 and the through hole 35. The contact pad 36 is connected at its bottom surface with a single layer TAB lead 74 whose other end is also connected to a connection target such as a printed circuit board (PCB) interconnect pad 38 provided on a PCB substrate 62.

The contact substrate 20 is mounted on the PCB substrate 62 through an elastomer 42 and a support structure $52_2$. The contact substrate 20, the elastomer 42, the support structure $52_2$ and the PCB substrate 62 are fixed with one another by, for example, an adhesive (not shown). In this example, the TAB lead 74 for connecting the contact pad 36 and the PCB pad 38 has a gull-wing shape where a gull-wing (lower) portion is bonded to the PCB pad 38. A support member 54 is provided on the support structure $52_2$ to support the TAB lead 74.

As noted above, the TAB lead 74 has a gull-wing shape which is similar to the standard "gull-wing lead" used in a surface mount technology. Because of the down-ward bent of the gull-wing type TAB lead 74, a sufficient vertical clearance is achieved at the left side of FIG. 11 over the contact portion between the PCB pad 38 and the TAB lead 74. The lead form of the TAB lead 74 (downward bent, gull-wing lead) may require special tooling to produce the same. A large number of interconnection between the contact pads and the PCB pads will be used in an actual application such as semiconductor device testing, for example several hundred connections. Thus, such tooling may be standardized for a multiple of contact pads with given pitch.

The electrical connections between the contact pad 36 and the TAB lead 74 and between the TAB lead 74 and the PCB pad 38 will be established by various bonding technologies including thermosonic bonding, thermocompression bonding, and ultrasonic bonding technique. In another aspect, such electrical connections will be established through a surface mount technology (SMT) such as using a screen printable solder paste. A soldering process is carried out based on the reflow characteristics of the solder paste and other solder materials well known in the art.

Figure 1:
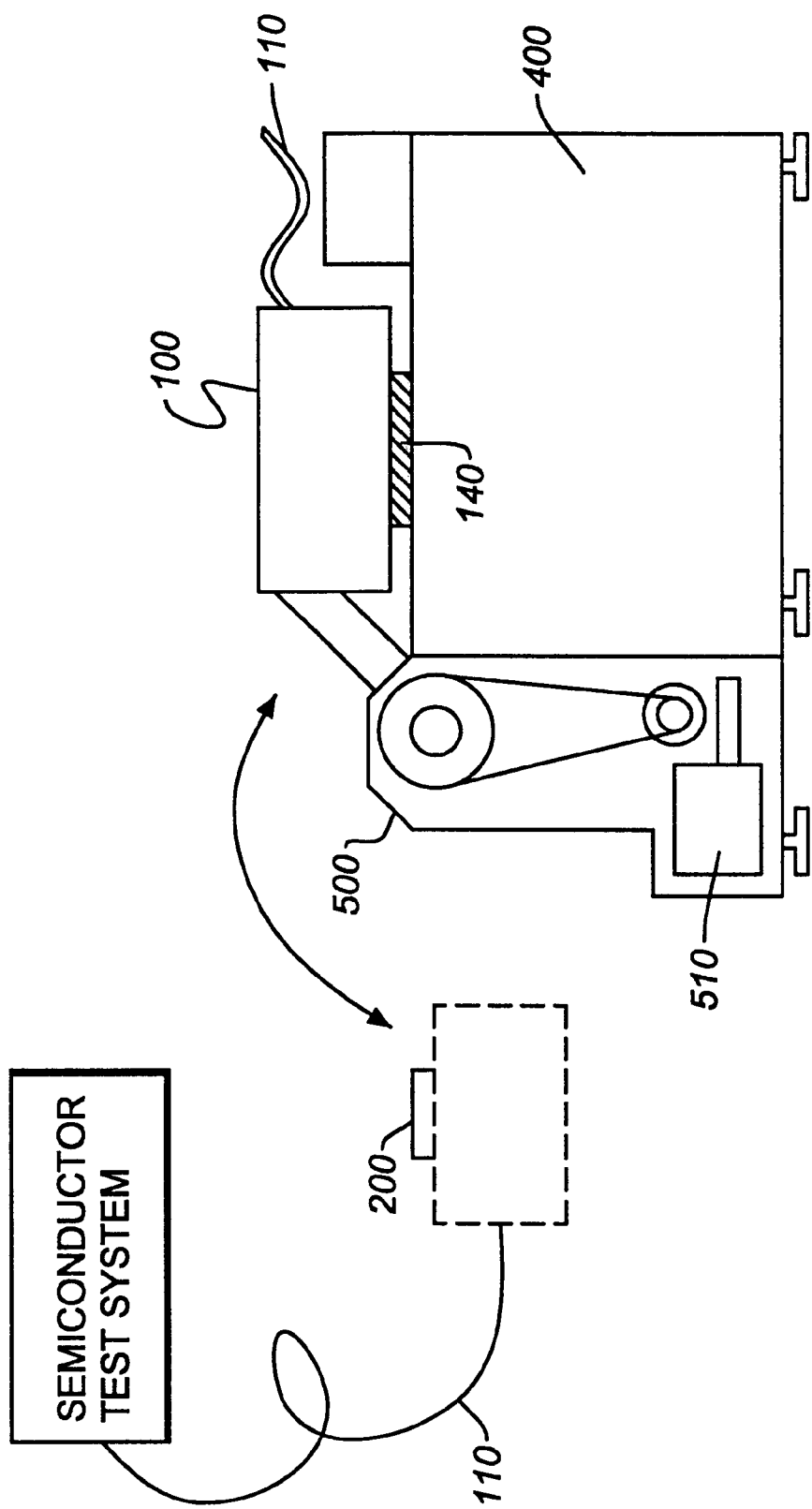
FIG. 1 is a schematic diagram showing a structural relationship between a substrate handler and a semiconductor test system having a test head.
Figure 2:
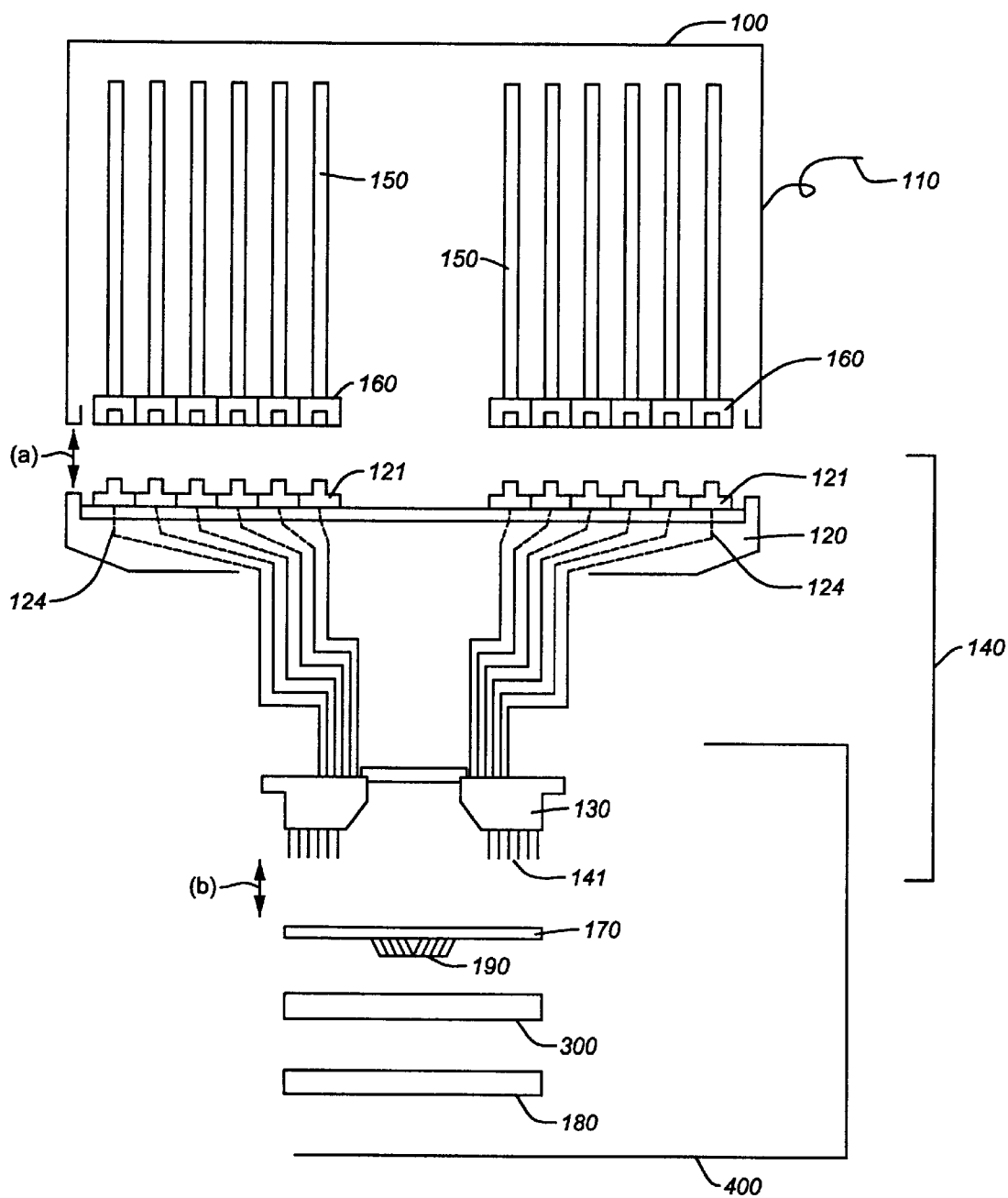
FIG. 2 is a schematic diagram showing an example of detailed structure for connecting the test head of the semiconductor test system to the substrate handler.

The PCB substrate 62 itself may be a probe card such as shown in FIG. 3 or provided separately from the probe card, and mounted directly or indirectly on the probe card. In the former case, the PCB 62 may make direct contact with an interface of a semiconductor test system such as an IC tester in a manner shown in FIG. 2. In the latter case, the PCB substrate 62 is pinned or in use of a conductive polymer for establishing an electrical contact to the next level of a contact mechanism on the probe card. Such types of electrical connection between the PCB substrate 62 and the probe card through pins or conductive polymer would allow for field repairability.

The PCB substrate 62 may be a multiple layer structure which is capable of providing high bandwidth signals, distributed high frequency capacitance and integrated high frequency chip capacitors for power supply decoupling as well as high pin counts (number of I/O pins and associated signal paths). An example of material of the PCB 62 is standard high performance glass epoxy resin. Another example of multilayer PCB substrate material is ceramic. The ceramic substrate is expected to minimize mismatch in coefficient of temperature expansion (CTE) rates during high temperature applications such as a burn-in test of semiconductor wafers and packaged IC devices.

The support structure $52_2$ is to establish a physical strength of the packaging and interconnection of the contact structure. The support structure $52_2$ is made of, for example, ceramic, molded plastic or metal. The elastomer 42 is to establish flexibility in the packaging and interconnection of the present invention to overcome a potential planarization mechanism. The elastomer 42 also functions to absorb a mismatch in temperature expansion rates between the contact substrate 20 and the PCB substrate 62.

An example of overall length of the signal path from the contact structure 30, the contact trace 32, the contact pad 36 and the TAB lead 74 is in the range of several hundred micrometers. Because of the short path length, the packaging interconnection of the present invention can be easily operable in a high frequency band such as several GHz or even higher. Moreover, because of a relatively small number of overall components to be assembled, the packaging and interconnection of the present invention can be fabricated with low cost and high reliability as well as high productivity.

Figure 12:
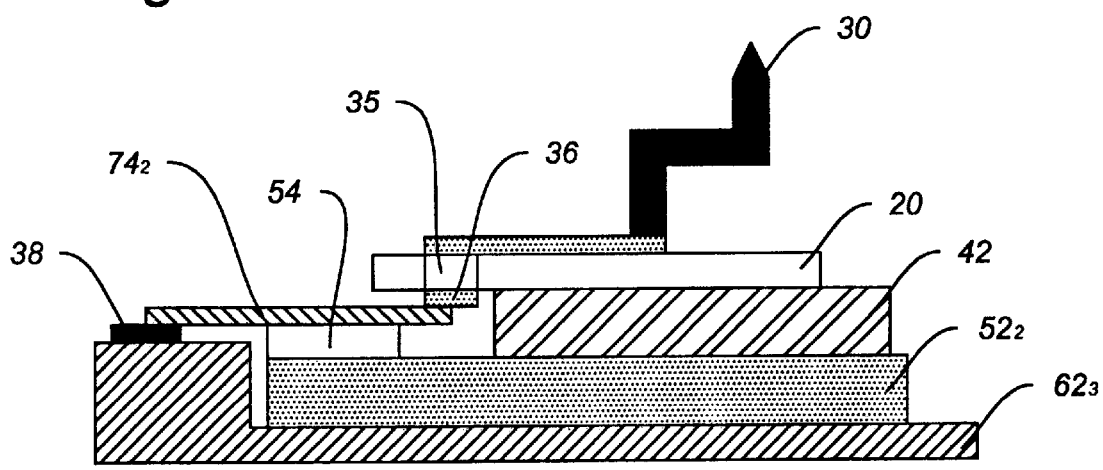
FIG. 12 is a schematic diagram showing a modified structure of the third embodiment of the present invention in which a straight shape TAB lead is incorporated as an interconnection and packaging member.

FIG. 12 shows another example of the third embodiment of the present invention. A TAB lead $74_2$ is straight and connects the contact pad 36 at the bottom of the contact substrate 20 to the PCB pad 38 provided on a printed circuit board (PCB) substrate $62_3$. To match the vertical position of the PCB pad 38, the PCB substrate $62_3$ has a raised portion at the left end thereof.

The electrical connection between the TAB lead $74_2$ and the PCB pad 38 will be established by a surface mount technology (SMT) such as using a screen printable solder paste as well as various other bonding technologies including thermosonic bonding, thermocompression bonding, and ultrasonic bonding technique. Because of the significantly small sizes of the components and signal path lengths involved in the contact structure 30, contact trace 32, contact pad 36, and the TAB lead $74_2$, the example of FIG. 12 can operate at a very high frequency band, such as several GHz. Moreover, because of the small number of components involved and simple structure of the components to be assembled, the interconnection and packaging of the present invention can be fabricated with low cost and high reliability as well as high productivity.

Figure 13:
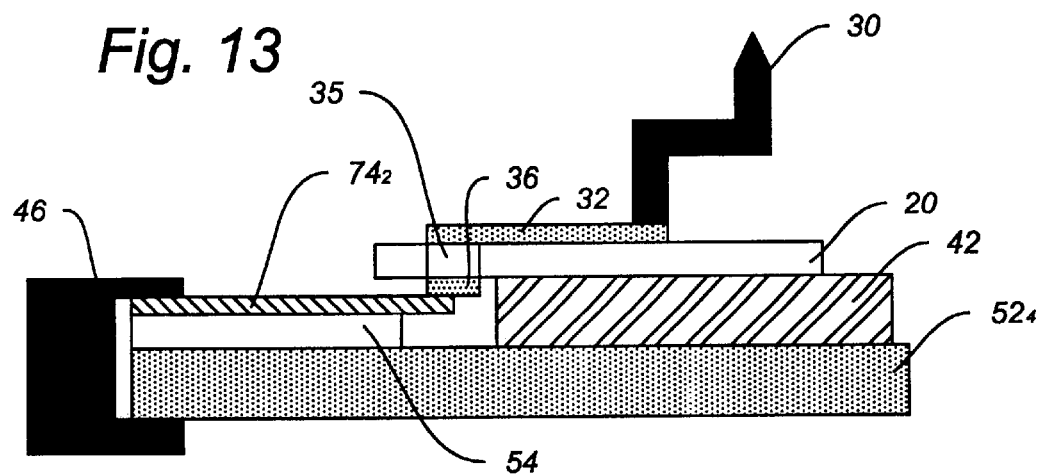
FIG. 13 is a schematic diagram showing a further modified structure of the third embodiment of the present invention in which a contact target is a connector.

FIG. 13 shows a further modification of the third embodiment of the present invention wherein the bottom type contact pad 36 is coupled to a connector provided on a printed circuit board or other structure. In the example of FIG. 13, the contact pad 36 provided at the bottom surface of the contact substrate is connected to a connector 46 via a single layer TAB lead $74_2$. The connector 46 is provided on a support structure $52_4$. The contact substrate 20 is a silicon substrate although other types of dielectric substrate, such as glass epoxy, polyimide, ceramic, and alumina substrates are also feasible.

The TAB lead $74_2$ has a straight shape as in the example of FIG. 12. At about the center of FIG. 13, the contact substrate 20 is mounted on the support structure $52_4$ through an elastomer 42. The contact substrate 20, the elastomer 42 and the support structure $52_4$ are attached with one another by, for example, an adhesive (not shown). The connector 46 may be mechanically fixed to the support structure $52_4$ through an attachment mechanism (not shown). The end of the TAB lead $74_2$ is inserted in a receptacle (not shown) of the connector 46. As is well known in the art, such a receptacle has a spring mechanism to provide a sufficient contact force when receiving the end of the TAB lead $74_2$ therein. Between the TAB lead $74_2$ and the support structure $52_4$, there is provided a support member 54 to support the TAB lead $74_2$ extending between the contact pad 36 and the connector 46. Also well known in the art, an inner surface of such a receptacle is provided with conductive metal such as gold, silver, palladium or nickel.

The connector 46 may be integrated with straight or right angle pins, which may be connected to the receptacle noted above, for direct connection to a printed circuit board (PCB). A PCB to mount the connector 46 thereon can be either solid or flexible. As is known in the art, a flexible PCB is formed on a flexible base material and has flat cables therein. Alternatively, the connector 46 may be integrated with a coaxial cable assembly in which a receptacle is attached to an inner conductor of the coaxial cable for receiving the end of the TAB lead $74_2$ therein. The connection between the connector 46 and the TAB lead $74_2$ or the support structure $52_4$ is not a permanent attachment method, allowing for field replacement and repairability of the contact portion.

Typically, the contact substrate 20 is a silicon substrate although other types of substrate, such as glass epoxy, polyimide, ceramic, and alumina substrates are also feasible. The support structure $52_4$ is to establish a physical strength of the packaging and interconnection of the contact structure. The support structure $52_4$ is made of, for example, ceramic, molded plastic or metal. The elastomer 42 is to establish flexibility in the interconnection and packaging of the present invention to overcome a potential planarization mechanism. The elastomer 42 also functions to absorb a mismatch in temperature expansion rates between the contact substrate 20 and a PCB substrate to mount the connector 46 thereon.

An example of an overall signal path length from the contact structure 30, the contact trace 32, the contact pad 36 to the end of the TAB lead $74_2$ is in the range of several hundred micrometers. Because of the short path length, the interconnection and packaging of the present invention can be easily operable in a high frequency band such as several GHz or even higher. Moreover, because of the lower total number of components to be assembled, the packaging and interconnection of the present invention can be fabricated with low cost and high reliability as well as high productivity.

Figure 14:
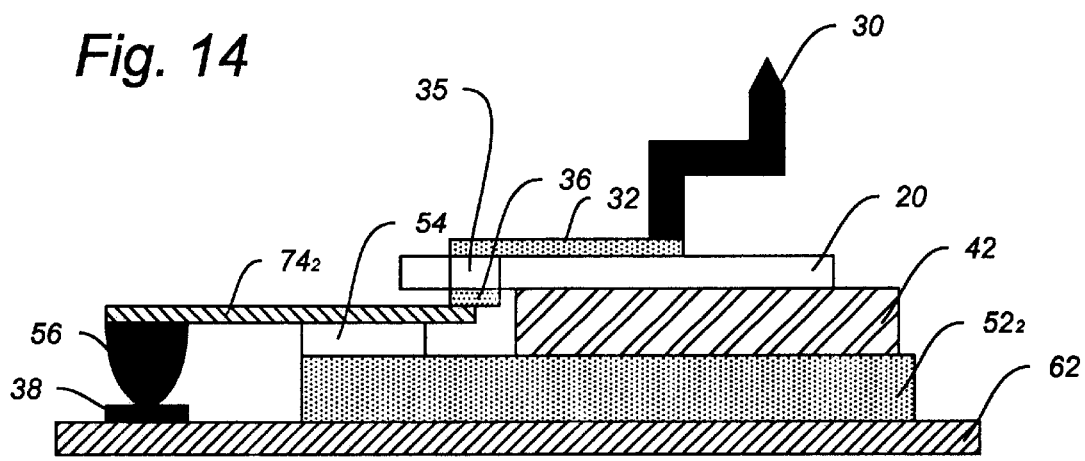
FIG. 14 is a schematic diagram showing a further modified structure of the third embodiment of the present invention in which a conductive bump is incorporated between the TAB lead and the contact target as one of interconnection and packaging members.

FIG. 14 shows a further example of the third embodiment of the present invention wherein the bottom type contact pad is coupled to a connection target such as an interconnect pad provided on a printed circuit board through a conductive bump. In the example of FIG. 14, a contact structure 30, a contact trace 32, a via hole 35, and a contact pad 36 are formed on a contact substrate 20. The contact structure 30 is formed on the upper surface of the contact substrate 20 while the contact pad 36 is formed on the bottom surface of the substrate 20. Typically, the contact substrate 20 is a silicon substrate although other types of dielectric substrate, such as glass epoxy, polyimide, ceramic, and alumina substrates are also feasible. The contact pad 36 is connected to a PCB (print circuit board) pad 38 provided on a PCB substrate 62 through a conductive bump 56 via a single layer TAB lead $74_2$.

The TAB lead $74_2$ has a straight shape as in the examples of FIGS. 12 and 13. The contact substrate 20 is mounted on the PCB substrate 62 through a support structure $52_2$ and an elastomer 42. The contact substrate 20, the elastomer 42, the support structure $52_2$, and the PCB substrate 62 are attached with one another by, for example, applying an adhesive (not shown). In FIG. 14, between the TAB lead $74_2$ and the support structure $52_2$, there is provided a support member 54 to support the TAB lead $74_2$ extending between the contact pad 36 and the PCB pad 38.

By the application of the heat, the conductive bump 56 is reflowed onto the PCB pad 38 for attachment between the TAB lead $74_2$ and the PCB pad 38. An example of the conductive bump 56 is a solder bump used in a standard solder ball technology. Another example of the conductive bump 56 is a fluxless solder ball used in a plasma-assisted dry soldering technology.

Further examples of the conductive bump 56 are a conductive polymer bump and a compliant bump which involve the use of polymer in the bump. This helps in minimizing planarization problems or CTE (coefficient of temperature expansion) mismatches in the packaging and interconnection. There is no reflowing of metal, which prevents bridging between contact points. The conductive polymer bump is made of a screen printable conductive adhesive. The compliant bump is a polymer core bump with a metal coating. The polymer is typically plated with gold and is elastically compressible. Still further example of the conductive bump 56 is a bump used in a controlled collapse chip connection technology in which solder balls are formed by an evaporation process.

The PCB substrate 62 itself may be a probe card such as shown in FIG. 3 or provided separately from the probe card and mounted directly or indirectly on the probe card. In the former case, the PCB substrate 62 may make direct contact with an interface of a semiconductor test system such as an IC tester in the manner shown in FIG. 2. In the latter case, the PCB substrate 62 is pinned or in use of a conductive polymer for establishing an electrical contact to the next level. Such types of electrical connection between the PCB substrate 62 and the probe card through pins or conductive polymer would allow for field repairability.

The PCB substrate 62 may be a multiple layer structure which is capable of providing high bandwidth signals, distributed high frequency capacitance and integrated high frequency chip capacitors for power supply decoupling as well as high pin counts (number of I/O pins and associated signal paths). An example of material of the PCB substrate 62 is standard high performance glass epoxy resin. Another example of the material is ceramic which is expected to minimize mismatch in coefficient of temperature expansion (CTE) rates during high temperature application such as a burn-in test of semiconductor wafers and packaged IC devices.

The support structure $52_2$ is to establish a physical strength of the packaging and interconnection of the contact structure. The support structure $52_2$ is made of, for example, ceramic, molded plastic or metal. The elastomer 42 is to establish flexibility in the packaging and interconnection of the present invention to overcome a potential planarization mechanism. The elastomer 42 also functions to absorb a mismatch in temperature expansion rates between the contact substrate 20 and the PCB substrate 62.

An example of overall length of the signal path extending from the contact structure 30, the contact trace 32, the contact pad 36 and the TAB lead $74_2$ is in the range of several hundred micrometers. Because of the short path length, the interconnection and packaging of the present invention can be easily operable in a high frequency band such as several GHz or even higher. Moreover, because of the lower total number of components to be assembled, the packaging and interconnection of the present invention can be fabricated with low cost and high reliability as well as high productivity.

Figure 15:
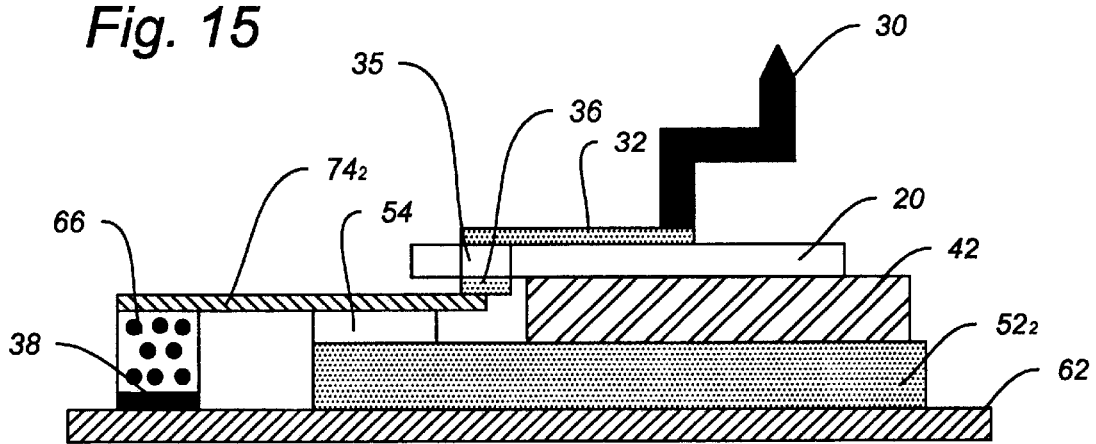
FIG. 15 is a schematic diagram showing a further modified structure of the third embodiment of the present invention in which a conductive polymer is incorporated between the TAB lead and the contact target as one of interconnection and packaging members.
Figure 16:
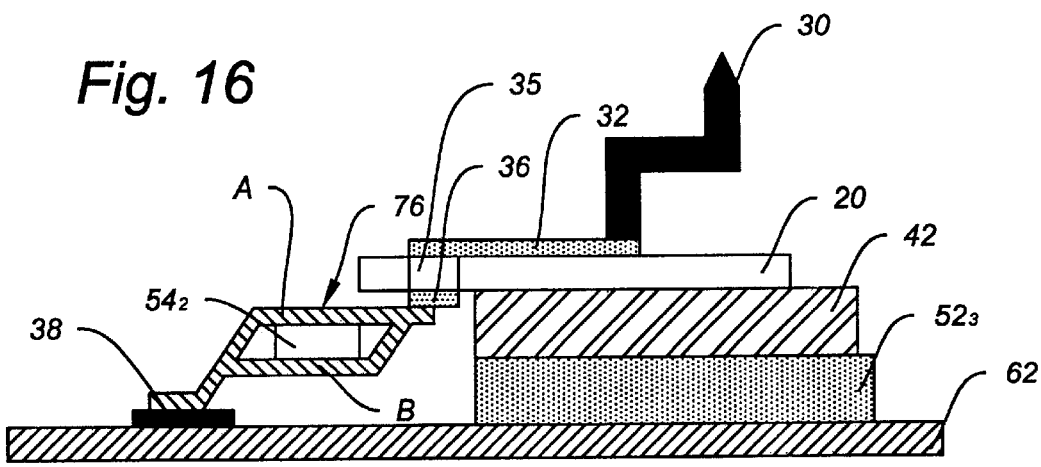
FIG. 16 is a schematic diagram showing a fourth embodiment of the present invention in which the packaging and interconnection is established by a double layer TAB (tape automated bonding) lead between a contact pad provided at a bottom surface of the contact substrate mounting the contact structure and a contact target on a probe card or a device package.

FIG. 15 shows a further example of the third embodiment of the present invention wherein the bottom type contact pad is coupled to an interconnect pad provided on a printed circuit board through a conductive polymer. In the example of FIG. 15, a contact structure 30, a contact trace 32, a via hole 35, and a contact pad 36 are formed on a contact substrate 20. The contact structure 30 is formed on the upper surface of the contact substrate 20 while the contact pad 36 is formed on the bottom surface of the substrate 20. The contact pad 36 is connected to a PCB (print circuit board) pad 38 provided on a PCB substrate 62 through a TAB lead $74_2$ and a conductive polymer 66. Typically, the contact substrate 20 is a silicon substrate although other types of dielectric substrate, such as glass epoxy, polyimide, ceramic, and alumina substrates are also feasible.

In this example, the TAB lead $74_2$ has a straight shape similar to the examples of FIGS. 12–14. The contact substrate 20 is mounted on the PCB substrate 62 through a support structure $52_2$ and an elastomer 42. The contact substrate 20, the elastomer 42, the support structure $52_2$, and the PCB substrate 62 are attached with one another by, for example, an adhesive (not shown)

Most conductive polymers are designed to be conductive between the mating electrodes normally in vertical of angled directions and not conductive in the horizontal direction. An example of the conductive polymer 66 is a conductive elastomer which is filled with conductive wire that extends beyond the surface of the elastomer.

Various other examples of the conductive polymer 66 are possible such as an anisotropic conductive adhesive, anisotropic conductive film, anisotropic conductive paste, and anisotropic conductive particles. The anisotropic conductive adhesive is filled with conductive particles that do not touch each other. The conductive path is formed by pressing the adhesive between the two electrodes at a specific location. The anisotropic conductive film is a thin dielectric resin filled with conductive particles that do not touch each other. The conductive path is formed by pressing the film between the two electrodes at a specific location.

The anisotropic conductive paste is a screen printable paste which is filled with conductive particles that do not touch each other. The conductive path is formed by pressing the paste between the two electrodes at a specific location. The anisotropic conductive particle is a thin dielectric resin filled with conductive particles coated with a very thin layer of dielectric material to improve isolation. The conductive path is formed by pressing the particle with enough force to explode the dielectric coating on the particles, between the two electrodes at a specific location.

The PCB substrate 62 itself may be a probe card such as shown in FIG. 3 or provided separately from the probe card and mounted directly or indirectly on the probe card. In the former case, the PCB substrate 62 may make direct contact with an interface of a semiconductor test system such as an IC tester in the manner shown in FIG. 2. In the latter case, the PCB substrate 62 is pinned or in use of a conductive polymer for establishing an electrical contact to the next level. Such types of electrical connection between the PCB substrate 62 and the probe card through pins or conductive polymer would allow for field repairability.

The PCB substrate 62 may be a multiple layer structure which is capable of providing high bandwidth signals, distributed high frequency capacitance and integrated high frequency chip capacitors for power supply decoupling as well as high pin counts (number of I/O pins and associated signal paths). An example of material of the PCB substrate 62 is standard high performance glass epoxy resin. Another example of material is ceramic which is expected to minimize mismatch in coefficient of temperature expansion (CTE) rates during high temperature application such as a burn-in test of semiconductor wafers and packaged IC devices.

The support structure $52_2$ is to establish a physical strength of the packaging and interconnection of the contact structure. The support structure $52_2$ is made of, for example, ceramic, molded plastic or metal. The elastomer 42 is to establish flexibility in the packaging and interconnection of the present invention to overcome a potential planarization mechanism. The elastomer 42 also functions to absorb a mismatch in temperature expansion rates between the contact substrate 20 and the PCB substrate 62.

An example of signal path length involved in this packaging and interconnection is in the range of several hundred micrometers. Because of the short path length, the packaging and interconnection of the present invention can be easily operable in a high frequency band such as several GHz or even higher. Moreover, because of the lower total number of components to be assembled, the interconnection and packaging of the present invention can be fabricated with low cost and high reliability as well as high productivity.

FIGS. 16–23 show a fourth embodiment of the present invention wherein the bottom type contact pad is coupled to a contact target through a double layer lead formed by a tape automated bonding (TAB) process. In the first example of FIG. 16, a contact structure 30 formed on a contact substrate 20 is electrically connected to a contact pad 36 via a contact trace 32 and a through hole 35. The contact structure 30 is formed on the upper surface of the contact substrate 20 while the contact pad 36 is formed on the bottom surface of the substrate 20. The contact pad 36 is connected at its bottom surface with a double layer TAB lead 76 whose other end is also connected to a printed circuit board (PCB) interconnect pad 38 provided on a PCB substrate 62.

The contact substrate 20 is mounted on the PCB substrate 62 through an elastomer 42 and a support structure $52_3$. The contact substrate 20, the elastomer 42, the support structure $52_3$ and the PCB substrate 62 are fixed with one another by, for example, an adhesive (not shown). In this example, the double layered TAB lead 76 for connecting the contact pad 36 and the PCB pad 38 has an upper lead A and a lower lead B. A support member $54_2$ is provided between the upper lead and the lower lead of the TAB lead 76.

The TAB lead 76 has a gull-wing shape which is similar to the standard "gull-wing lead" lead used in a surface mount technology. Because of the down-ward bent of the gull-wing type TAB lead 76, a sufficient vertical clearance is achieved at the left side of FIG. 16 over the contact portion between the PCB pad 38 and the TAB lead 76. The lead form of the TAB lead 76 (downward bent, gull-wing lead) may require special tooling to produce the same. Since a large number of interconnection between the contact pads and the PCB pads will be used in an actual application such as semiconductor device testing, several hundred connections for example, such tooling may be standardized for a multiple of contact traces with given pitch.

The structure of the TAB lead 76 having the tiered leads A and B establish a low resistance in a signal path because of two leads running in parallel. This is useful in transmitting a large current such as in a ground line or a power line of a probe card for testing a semiconductor device with high speed without deforming the waveforms of test signals.

The electrical connections between the contact pad 36 and the TAB lead 76 and between the TAB lead 76 and the PCB pad 38 will be established by various bonding technologies including thermosonic bonding, thermocompression bonding, and ultrasonic bonding technique. In another aspect, such electrical connections will be established through a surface mount technology (SMT) such as using a screen printable solder paste. A soldering process is carried out based on the reflow characteristics of the solder paste and other solder materials well known in the art.

The PCB substrate 62 itself may be a probe card such as shown in FIG. 3 or provided separately and mounted directly or indirectly on the probe card. In the former case, the PCB substrate 62 may make direct contact with an interface of a semiconductor test system such as an IC tester in a manner shown in FIG. 2. In the latter case, the PCB substrate 62 is pinned or in use of a conductive polymer for establishing an electrical contact to the next level of a contact mechanism on the probe card. Such types of electrical connection between the PCB substrate 62 and the probe card through pins or conductive polymer would allow for field repairability.

The PCB substrate 62 may be a multiple layer structure which is capable of providing high bandwidth signals, distributed high frequency capacitance and integrated high frequency chip capacitors for power supply decoupling as well as high pin counts (number of I/O pins and associated signal paths). An example of material of the PCB 62 is standard high performance glass epoxy resin. Another example of material is ceramic which is expected to minimize mismatch in coefficient of temperature expansion (CTE) rates during high temperature application such as a burn-in test of semiconductor wafers and packaged IC devices.

The support structure $52_3$ is to establish a physical strength of the packaging and interconnection of the contact structure. The support structure $52_3$ is made of, for example, ceramic, molded plastic or metal. The elastomer 42 is to establish flexibility in the packaging and interconnection of the present invention to overcome a potential planarization mechanism. The elastomer 42 also functions to absorb a mismatch in temperature expansion rates between the contact substrate 20 and the PCB substrate 62.

An example of overall signal path length extending from the contact structure 30 to the PCB pad 38 is in the range several hundred micrometers. Because of the short path length, the packaging interconnection of the present invention can be easily operable in a high frequency band such as several GHz or even higher. Moreover, because of a relatively small number of overall components to be assembled, the packaging and interconnection of the present invention can be fabricated with low cost and high reliability as well as high productivity.

Figure 17:
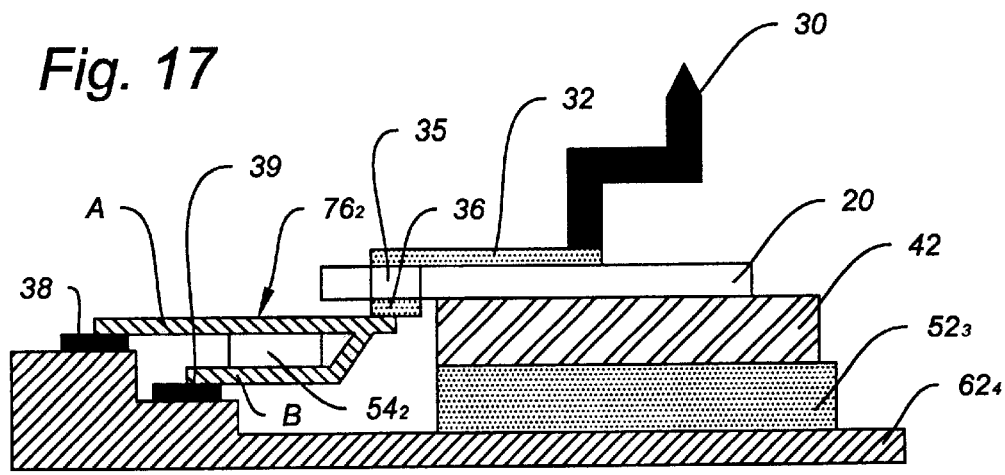
FIG. 17 is a schematic diagram showing a modified structure of the fourth embodiment of the present invention in which a straight shape double layer TAB lead is incorporated as an interconnection and packaging member to be connected to a pair of contact targets.

FIG. 17 shows another example of the fourth embodiment of the present invention. In this example, a double layered TAB lead $76_2$ having upper and lower leads A and B is provided to the contact pad 36 connected to the contact structure 30. The upper lead A is provided in an upper and outer position of FIG. 17 than the lower lead B. The upper lead A is connected to a PCB pad 38 and the lower lead B is connected to a PCB pad 39. To accommodate the PCB pads 38 and 39 thereon, a PCB substrate $62_4$ is arranged to have an edge having a larger thickness, i.e., a step, to mount the PCB pad 38, and an inner portion adjacent to the edge portion having a smaller thickness to mount the PCB pad 39.

The electrical connection between the TAB lead $76_2$ and the PCB pads 38 and 39 will be established by a surface mount technology (SMT) such as using a screen printable solder paste as well as various other bonding technologies including thermosonic bonding, thermocompression bonding, and ultrasonic bonding technique. Because of the significantly small sizes of the components and signal path lengths involved in the contact structure 30, contact trace 32, contact pad 36, and the TAB lead $76_2$, the example of FIG. 17 can operate at a very high frequency band, such as several GHz. Moreover, because of the small number and simple structure of components to be assembled, the interconnection and packaging of the present invention can be fabricated with low cost and high reliability as well as high productivity.

The structure of the TAB lead $76_2$ having the double layered leads A and B establishes a fan out in the vertical dimension. This is useful in distributing a signal or power to two or more paths. Another advantage of the fan out is to increase the number of contact pads on both the contact substrate and the PCB substrate. In other words, it is possible to decrease the effective pitch (distance) between the contact pads.

Figure 18:
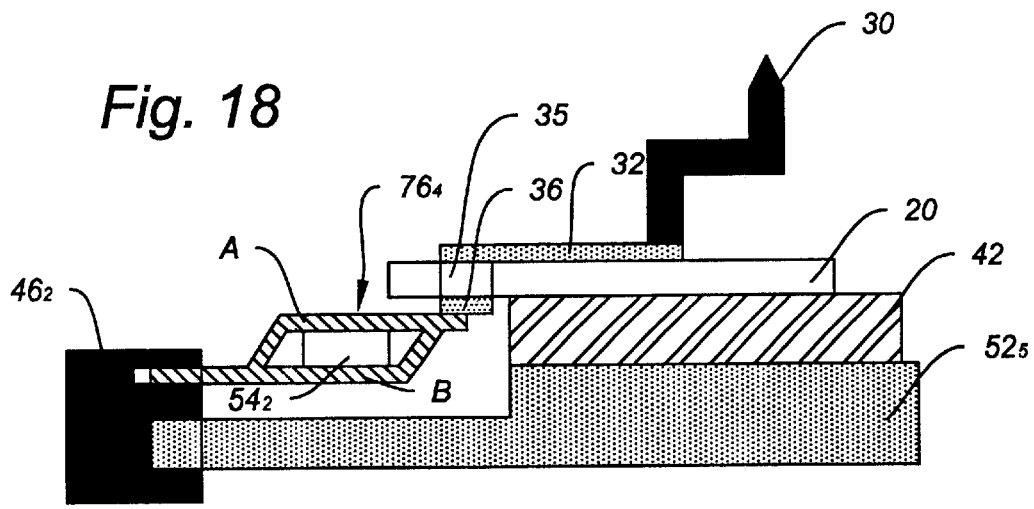
FIG. 18 is a schematic diagram showing a further modified structure of the fourth embodiment of the present invention in which a contact target is a connector to be connected with the double layer TAB lead.

FIG. 18 shows a further modification of the fourth embodiment of the present invention wherein the bottom type contact pad 36 is coupled to a connector provided on a printed circuit board or other structure. In the example of FIG. 18, a contact pad 36 connected to the contact structure 30 is connected to a connector $46_2$ through a double layer TAB lead $76_4$. The connector $46_2$ is provided on a support structure $52_5$.

Typically, the contact structure 30, contact trace 32, through hole 35 and the contact pad 36 are formed on the contact substrate 20 through photolithography processes. The contact structure 30 is formed on the upper surface of the contact substrate 20 while the contact pad 36 is formed on the bottom surface of the substrate 20. The contact substrate 20 is a silicon substrate although other types of dielectric substrate, such as glass epoxy, polyimide, ceramic, and alumina substrates are also feasible.

The connector $46_2$ may be mechanically fixed to the support structure $52_5$ through an attachment mechanism (not shown). The end of the TAB lead $76_4$ is inserted in a receptacle (not shown) of the connector $46_2$. As is well known in the art, such a receptacle has a spring mechanism to provide a sufficient contact force when receiving the end of the TAB lead $76_4$ therein. Between the upper lead A and the lower lead B of the double layer TAB lead $76_4$, there is provided a support member $54_2$ to support the leads A and B of the TAB lead $76_4$ extending between the contact pad 36 and the connector $46_2$. Also well known in the art, an inner surface of such receptacles are provided with conductive metal such as gold, silver, palladium or nickel.

The structure of the TAB lead $76_4$ having the tiered leads A and B establish a low resistance in a signal path because of the two leads. This is useful in transmitting a large current such as in a ground line or a power line for testing a semiconductor device with high speed without deforming the waveforms of the test signals.

The connector $46_2$ may be integrated with straight or right angle pins, which may be connected to the receptacle noted above, for direct connection to a printed circuit board (PCB). A printed circuit board (PCB) to mount the connector $46_2$ thereon can be either solid or flexible. As is known in the art, a flexible PCB is formed on a flexible base material and has flat cables therein. Alternatively, the connector $46_2$ may be integrated with a coaxial cable assembly in which a receptacle is attached to an inner conductor of the coaxial cable for receiving the ends of the TAB lead $76_4$ therein. The connection between the connector $46_2$ and the TAB lead $76_4$ or the support structure $52_5$ is not a permanent attachment method, allowing for field replacement and repairability of the contact portion.

The support structure $52_5$ is to ensure a physical strength of the packaging and interconnection of the contact structure. The support structure $52_5$ is made of, for example, ceramic, molded plastic or metal. The elastomer 42 is to establish flexibility in the interconnection and packaging of the present invention to overcome a potential planarization mechanism. The elastomer 42 also functions to absorb a mismatch in temperature expansion rates between the contact substrate 20 and a PCB substrate to mount the connector $46_2$ thereon.

Figure 19:
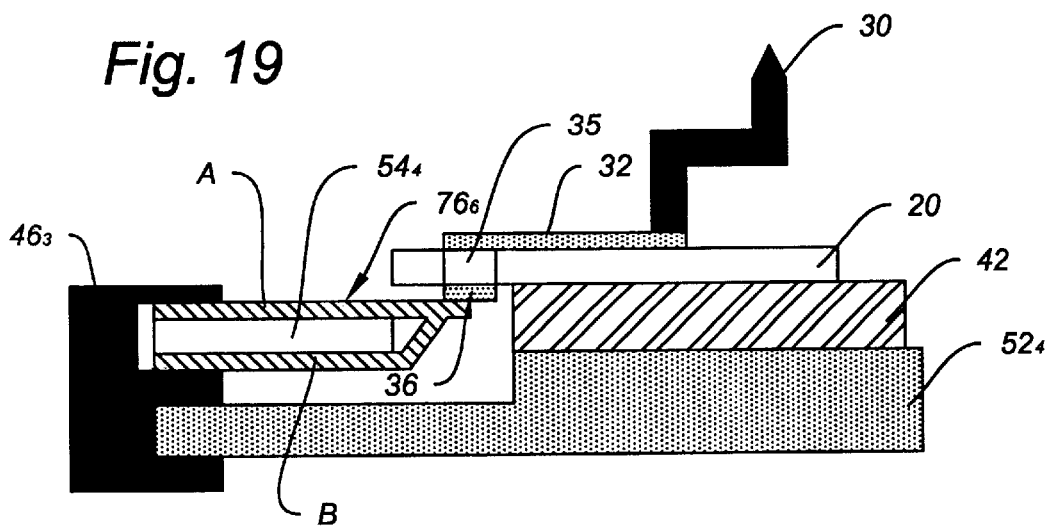
FIG. 19 is a schematic diagram showing a further modified structure of the fourth embodiment of the present invention in which a contact target is a connector to be connected with the straight shape double layer TAB lead.

FIG. 19 shows a further modification of the fourth embodiment of the present invention wherein the bottom type contact pad 36 is coupled to a connector provided on a printed circuit board or other structure. In the example of FIG. 19, a contact pad 36 connected to the contact structure 30 is connected to a connector $46_3$ via a double layer TAB lead $76_6$. The double layer TAB lead $76_6$ has an upper lead A and a lower lead B, each of which is separated from one another at the end. The connector $46_3$ is provided on a support structure $52_4$.

The connector $46_3$ may be mechanically fixed to the support structure $52_4$ through an attachment mechanism (not shown). The ends of the leads A and B of the TAB lead $76_6$ are inserted in receptacles (not shown) of the connector $46_3$. As is well known in the art, such a receptacle has a spring mechanism to provide a sufficient contact force when receiving the end of the TAB lead $76_6$ therein. Between the upper lead A and the lower lead B of the double layer TAB lead $76_6$, there is provided a support member $54_4$ to support the leads A and B.

The structure of the TAB lead $76_6$ having the double layered leads A and B establishes a fan out in the vertical dimension. This is useful in distributing a signal or power to two or more paths. Another advantage of the fan out is to increase the number of contact pads, i.e., to decrease the effective pitch (distance) between the contact pads.

Figure 20:
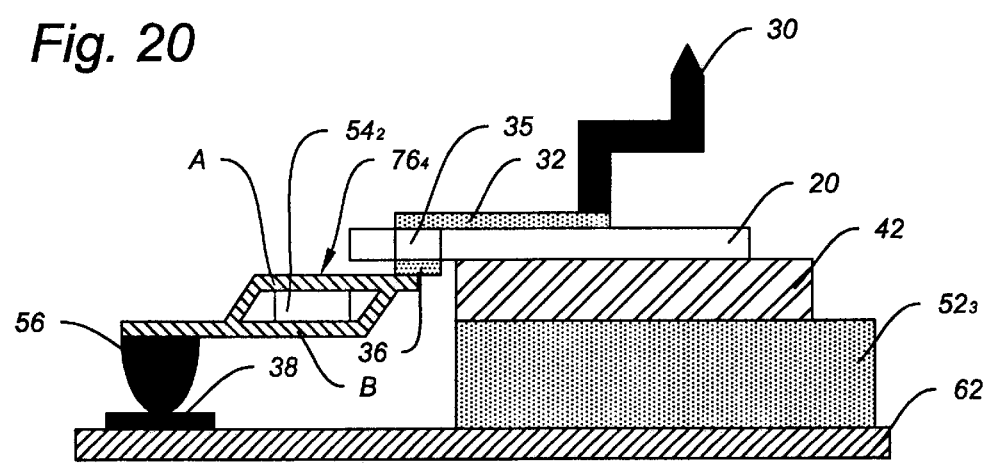
FIG. 20 is a schematic diagram showing a further modified structure of the fourth embodiment of the present invention in which a conductive bump is incorporated between the TAB lead and the contact target as one of interconnection and packaging members.

FIG. 20 shows a further example of the fourth embodiment of the present invention wherein the bottom type contact pad is coupled to an interconnect pad provided on a printed circuit board through a conductive bump. In the example of FIG. 20, a contact structure 30, a contact trace 32, a through hole 35 and a contact pad 36 are formed on a contact substrate 20. The contact structure 30 is formed on the upper surface of the contact substrate 20 while the contact pad 36 is formed on the bottom surface of the substrate 20.

Typically, the contact substrate 20 is a silicon substrate although other types of dielectric substrate, such as glass epoxy, polyimide, ceramic, and alumina substrates are also feasible. The contact pad 36 at the bottom of the contact substrate 20 is connected to a PCB (print circuit board) pad 38 provided on a PCB substrate 62 through a conductive bump 56 through a double layer TAB lead $76_4$.

The contact substrate 20 is mounted on the PCB substrate 62 through a support structure $52_3$ and an elastomer 42. The contact substrate 20, the elastomer 42, the support structure $52_3$, and the PCB substrate 62 are attached with one another by, for example, an adhesive (not shown). Between the upper lead A and the lower lead B of the TAB lead $76_4$, there is provided with a support member $54_2$ to support the upper and lower leads A and B.

By the application of the heat, the conductive bump 56 is reflowed onto the PCB pad 38 for attachment between the TAB lead $76_4$ and the PCB pad 38. An example of the conductive bump 56 is a solder bump used in a standard solder ball technology. Another example of the conductive bump 56 is a fluxless solder ball used in a plasma-assisted dry soldering technology.

Further examples of the conductive bump 56 are a conductive polymer bump and a compliant bump which involve the use of polymer in the bump. This helps in minimizing planarization problems or CTE (coefficient of temperature expansion) mismatches in the packaging and interconnection. There is no reflowing of metal, which prevents bridging between contact points. The conductive polymer bump is made of a screen printable conductive adhesive. The compliant bump is a polymer core bump with a metal coating. The polymer is typically plated with gold and is elastically compressible. Still further example of the conductive bump 56 is a bump used in a controlled collapse chip connection technology in which solder balls are formed by an evaporation process.

The structure of the TAB lead $76_4$ having the tiered leads A and B establish a low resistance in a signal path because of the two leads. This is useful in transmitting a large current such as in a ground line or a power line in a probe card for testing a semiconductor device with high speed without deforming the waveforms of the test signals.

Figure 21:
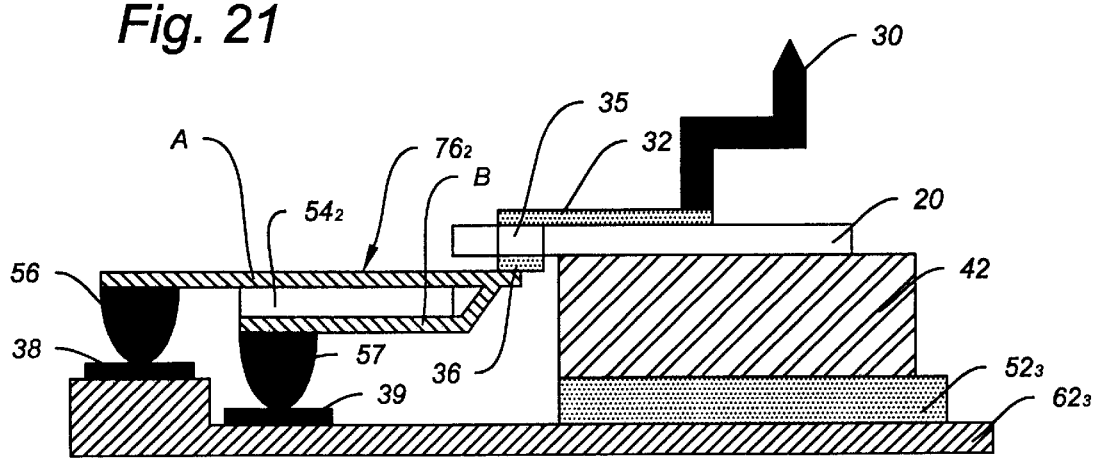
FIG. 21 is a schematic diagram showing a further modified structure of the fourth embodiment of the present invention in which a pair of conductive bumps are incorporated between the double layer TAB lead and the contact targets as interconnection and packaging members.

FIG. 21 shows a further example of the fourth embodiment of the present invention. In this example, a double layered TAB lead $76_2$ having upper and lower leads A and B are provided to the contact pad 36 connected to the contact structure 30. The upper lead A is provided in an upper and outer position than the lower lead B in FIG. 21. The upper lead A is connected to a PCB pad 38 via a conductive dump 56 and the lower lead B is connected to a PCB pad 39 via a conductive dump 57. To accommodate the PCB pads 38 and 39 thereon, a PCB substrate $62_3$ is arranged to have an edge having a larger thickness, i.e., a step, to mount the PCB pad 38, and an inner portion adjacent to the edge portion having a smaller thickness to mount the PCB pad 39.

By the application of the heat, the conductive bumps 56 and 57 are reflowed onto the PCB pads 38 and 39 for attachment between the TAB lead $76_2$ and the PCB pads 38 and 39. An example of the conductive bumps 56 and 57 is a solder bump used in a standard solder ball technology. Another example of the conductive bumps 56 and 57 is a fluxless solder ball used in a plasma-assisted dry soldering technology.

The structure of the TAB lead $76_2$ having the double layered leads A and B establishes a fan out in the vertical dimension. This is useful in distributing a signal or power to two or more paths. Another advantage of the fan out is to increase the number of contact pads, i.e., to decrease the effective pitch (distance) between the contact pads.

Figure 22:
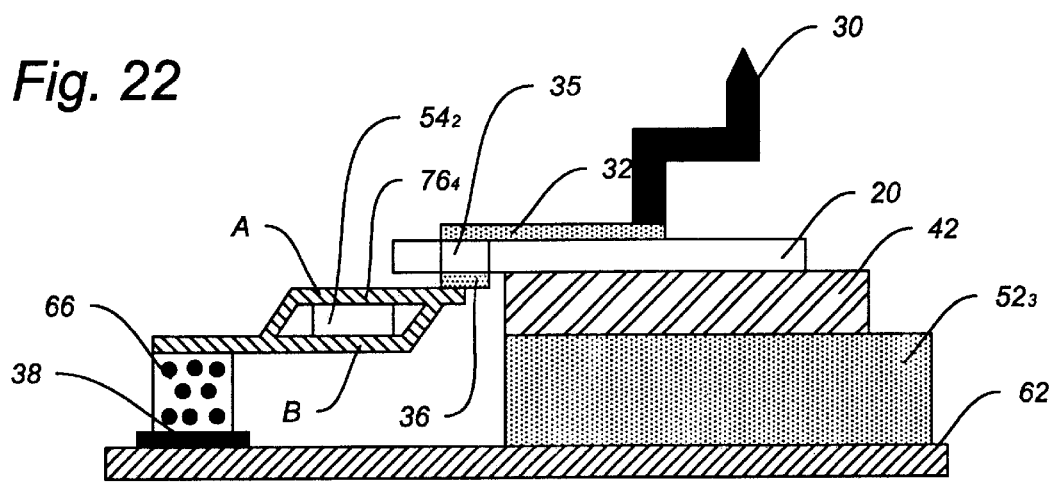
FIG. 22 is a schematic diagram showing a further modified structure of the fourth embodiment of the present invention in which a conductive polymer is incorporated between the double layer TAB lead and the contact target as one of interconnection and packaging members.

FIG. 22 shows a further example of the fourth embodiment of the present invention wherein the bottom type contact pad is coupled to a connection target such as an interconnect pad provided on a printed circuit board through a conductive polymer. In the example of FIG. 22, a contact structure 30, a contact trace 32, a through hole 35, and a contact pad 36 are formed on a contact substrate 20. The contact structure 30 is formed on the upper surface of the contact substrate 20 while the contact pad 36 is formed on the bottom surface of the substrate 20. Typically, the contact substrate 20 is a silicon substrate although other types of dielectric substrate, such as glass epoxy, polyimide, ceramic, and alumina substrates are also feasible. The contact pad 36 is connected to a PCB (print circuit board) pad 38 provided on a PCB substrate 62 through a conductive polymer 66 via a double layer TAB lead $76_4$.

The contact substrate 20 is mounted on the PCB substrate 62 through a support structure $52_3$ and an elastomer 42. The contact substrate 20, the elastomer 42, the support structure $52_3$, and the PCB substrate 62 are attached with one another by, for example, an adhesive (not shown). Between the upper lead A and the lower lead B of the TAB lead $76_4$ there is provided with a support member $54_2$ to support the upper and lower leads A and B.

Most conductive polymers are designed to be conductive between the mating electrodes normally in vertical of angled directions and not conductive in the horizontal direction. An example of the conductive polymer 66 is a conductive elastomer which is filled with conductive wire that extends beyond the surface of the elastomer.

Various other examples of the conductive polymer 66 are possible such as an anisotropic conductive adhesive, anisotropic conductive film, anisotropic conductive paste, and anisotropic conductive particles. The anisotropic conductive adhesive is filled with conductive particles that do not touch each other. The conductive path is formed by pressing the adhesive between the two electrodes at a specific location. The anisotropic conductive film is a thin dielectric resin filled with conductive particles that do not touch each other. The conductive path is formed by pressing the film between the two electrodes at a specific location.

The anisotropic conductive paste is a screen printable paste which is filled with conductive particles that do not touch each other. The conductive path is formed by pressing the paste between the two electrodes at a specific location.

The anisotropic conductive particle is a thin dielectric resin filled with conductive particles coated with a very thin layer of dielectric material to improve isolation. The conductive path is formed by pressing the particle with enough force to explode the dielectric coating on the particles, between the two electrodes at a specific location.

The structure of the TAB lead $76_4$ having the tiered leads A and B establish a low resistance in a signal path because of the two leads. This is useful in transmitting a large current such as in a ground line or a power line in a probe card for testing a semiconductor device with high speed without deforming the waveforms of the test signals.

Figure 23:
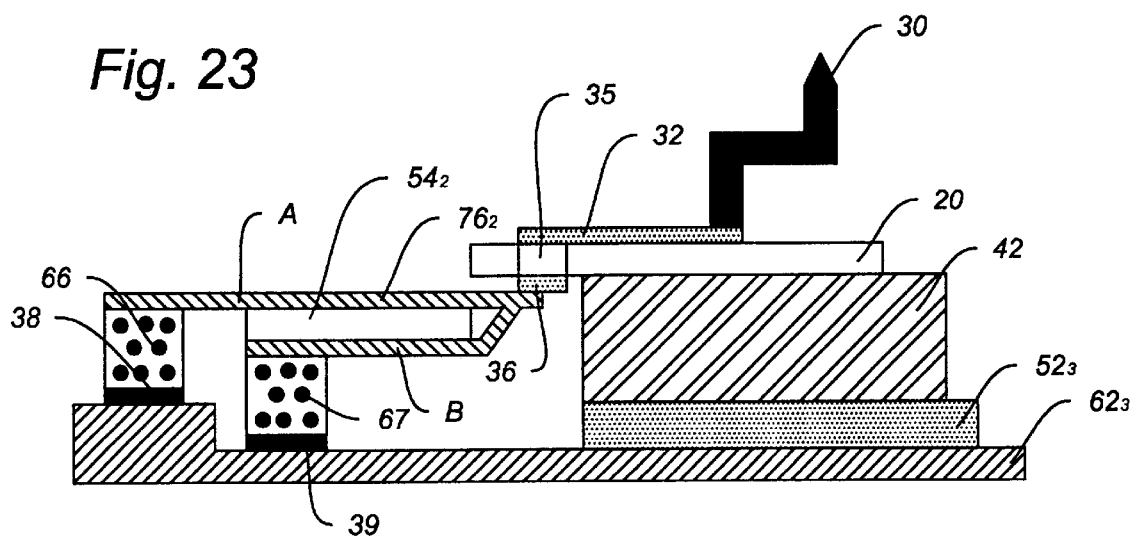
FIG. 23 is a schematic diagram showing a further modified structure of the fourth embodiment of the present invention in which a pair of conductive polymer are incorporated between the double layer TAB lead and the contact targets as interconnection and packaging members.
Figure 24:
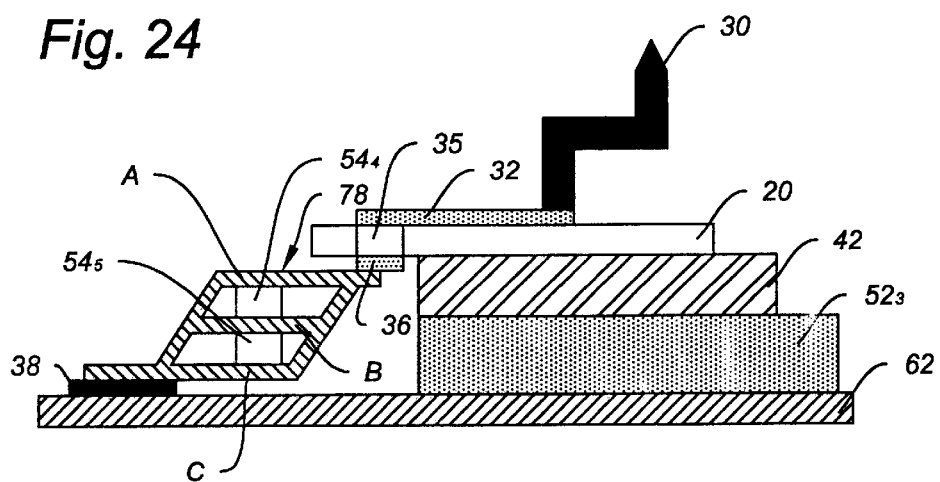
FIG. 24 is a schematic diagram showing a fifth embodiment of the present invention in which the packaging and interconnection is established by a triple layer TAB (tape automated bonding) lead between a contact pad provided at a bottom surface of the contact substrate mounting the contact structure and a contact target on a probe card or a device package.

FIG. 23 shows another example of the fourth embodiment of the present invention. In this example, a double layered TAB lead $76_2$ having upper and lower leads A and B are provided to the contact pad 36 connected to the contact trace 32 and contact structure 30. The upper lead A is provided in an upper and outer position than the lower lead B in FIG. 23. The upper lead A is connected to a PCB (printed circuit board) pad 38 via a conductive polymer 66 and the lower lead B is connected to a PCB pad 39 via a conductive polymer 67. To accommodate the PCB pads 38 and 39 thereon, a PCB substrate $62_3$ is arranged to have an edge having a larger thickness, i.e., a step, to mount the PCB pad 38, and an inner portion adjacent to the edge portion having a smaller thickness to mount the PCB pad 39.

The electrical connection between the TAB lead $76_2$ and the PCB pads 38 and 39 will be established by a surface mount technology (SMT) such as using a screen printable solder paste as well as various other bonding technologies including thermosonic bonding, thermocompression bonding, and ultrasonic bonding technique.

The structure of the TAB lead $76_2$ having the double layered leads A and B establishes a fan out in the vertical dimension. This is useful in distributing a signal or power to two or more paths. Another advantage of the fan out is to increase the number of contact pads, i.e., to decrease the effective pitch (distance) between the contact pads.

FIGS. 24–31 show a fifth embodiment of the present invention wherein the bottom type contact pad is coupled to a contact target through a triple layer lead formed by a tape automated bonding (TAB) process. In the first example of FIG. 24, the contact structure 30 formed on a contact substrate 20 is electrically connected to the contact pad 36 via the contact trace 32 and the through hole 35. The contact structure 30 is formed on the upper surface of the contact substrate 20 while the contact pad 36 is formed on the bottom surface of the substrate 20. The contact pad 36 is connected at its bottom surface with a three layer TAB lead 78 which is also connected to a printed circuit board (PCB) interconnect pad 38 provided on a PCB substrate 62.

The contact substrate 20 is mounted on the PCB substrate 62 through an elastomer 42 and a support structure $52_3$. The contact substrate 20, the elastomer 42, the support structure $52_3$ and the PCB substrate 62 are fixed with one another by, for example, an adhesive (not shown). In this example, the triple layered TAB lead 78 for connecting the contact pad 36 and the PCB pad 38 has an upper lead A, an intermediate lead B and a lower lead C. A support member $54_4$ is provided between the upper lead A and the intermediate lead B of the triple layered TAB lead 78. A support member $54_5$ is provided between the intermediate lead B and the lower lead C of the triple layered TAB lead 78.

The TAB lead 78 as a whole has a gull-wing shape which is similar to the standard "gull-wing lead" lead used in a surface mount technology. Because of the down-ward bent of the gull-wing type TAB lead 78, a sufficient vertical clearance is achieved at the left end of FIG. 24 over the contact portion between the PCB pad 38 and the TAB lead 78. The form of the TAB lead 78 (downward bent, gull-wing lead) may require special tooling to produce the same. Since a large number of interconnection between the contact trace and the PCB pad will be used in the application such as semiconductor testing, several hundred connections, such tooling may be standardized for a multiple of contact traces with given pitch.

The structure of the TAB lead 78 having the tiered leads A, B and C establishes a low resistance and a large current capacity in a signal path because of the three conductive leads running in parallel. This is useful in transmitting a large current such as in a ground line or a power line in a probe card for testing a semiconductor device with high speed without deforming the waveforms of test signals.

Figure 25:
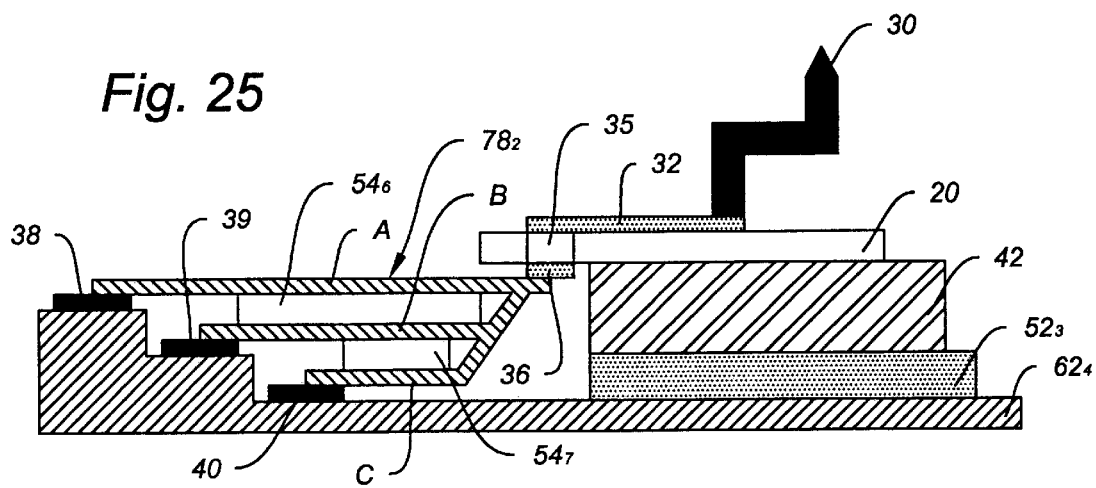
FIG. 25 is a schematic diagram showing a modified structure of the fifth embodiment of the present invention in which a straight shape triple layer TAB lead is incorporated as one of interconnection and packaging members to be connected to three contact targets.

FIG. 25 shows another example of the fifth embodiment of the present invention. In this example, a triple layered TAB lead $78_2$ having upper, intermediate and lower leads A, B and C is provided to the contact pad 36 connected to the contact trace 32, through hole 35 and contact structure 30. The contact structure 30 is formed on the upper surface of the contact substrate 20 while the contact pad 36 is formed on the bottom surface of the substrate 20.

The upper lead A is provided in an upper and outer position of FIG. 25 than the intermediate lead B. The intermediate lead B is provided in an upper and outer position of FIG. 25 than the lower lead C. The upper lead A is connected to a PCB pad 38, the intermediate lead B is connected to a PCB pad 39, and the lower lead C is connected to a PCB pad 40. To accommodate the PCB pads 38, 39 and 40 thereon, a PCB substrate $62_4$ is arranged to have steps to mount the PCB pads 38, 39 and 40 with different vertical positions. A support member $54_6$ is provided between the upper lead A and the intermediate lead B and a support member $54_7$ is provided between the intermediate lead B and the lower lead C.

The electrical connection between the TAB lead $78_2$ and the PCB pads 38, 39 and 40 will be established by a surface mount technology (SMT) such as using a screen printable solder paste as well as various other bonding technologies including thermosonic bonding, thermocompression bonding, and ultrasonic bonding technique. Because of the significantly small sizes of the components and signal path lengths involved in the contact structure 30, contact trace 32, and the TAB lead $78_2$, the example of FIG. 25 can operate at a very high frequency band, such as several GHz. Moreover, because of the small number and simple structure of components to be assembled, the interconnection and packaging of the present invention can be fabricated with low cost and high reliability as well as high productivity.

The structure of the TAB lead $78_2$ having the triple layered leads A, B and C establishes a fan out in the vertical dimension of the TAB lead. This is useful in distributing a signal or power to two or more paths. Another advantage of the fan out is to increase the number of contact pads, i.e., to decrease the effective pitch (distance) between the contact pads.

Figure 26:
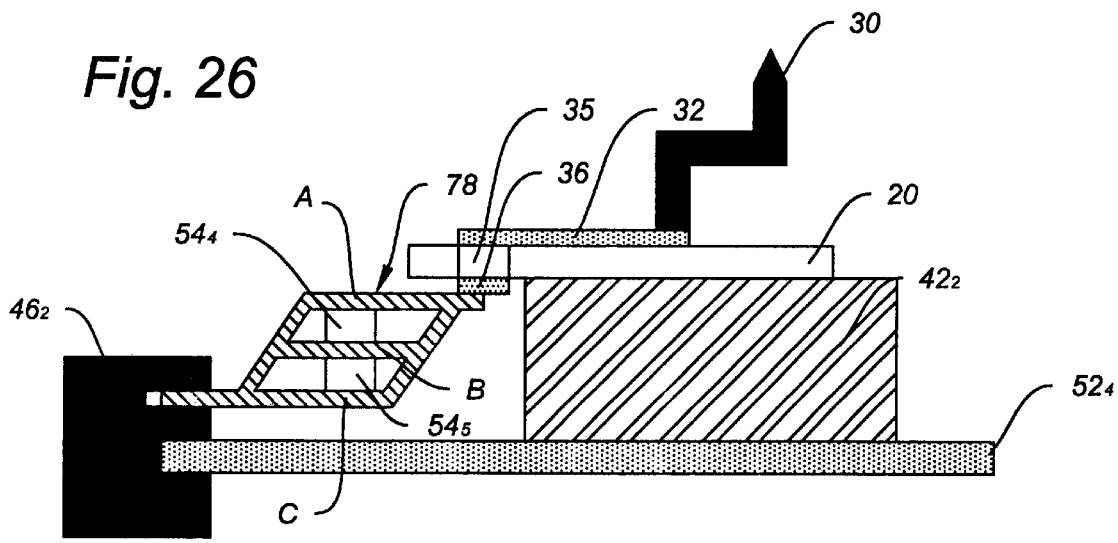
FIG. 26 is a schematic diagram showing a further modified structure of the fifth embodiment of the present invention in which a contact target is a connector to be connected with the triple layer TAB lead.

FIG. 26 shows a further modification of the fifth embodiment of the present invention wherein the bottom type contact pad 36 is coupled to a connector provided on a printed circuit board or other structure. In the example of FIG. 26, a contact pad 36 connected to the contact structure 30 is connected to a connector $46_2$ via a triple layer TAB lead 78 which has the same shape as that shown in FIG. 24. The connector $46_2$ is provided on a support structure $52_4$.

The connector 46₂ may be mechanically fixed to the support structure 52₄ through an attachment mechanism (not shown). The end of the TAB lead 78 is inserted in a receptacle (not shown) of the connector 46₂. As is well known in the art, such a receptacle has a spring mechanism to provide a sufficient contact force when receiving the end of the TAB lead 78 therein. Between the upper lead A and the intermediate lead B of the double layer TAB lead 78, there is provided a support member 54₄ to support the leads A and B. Between the intermediate lead B and the lower lead C of the double layer TAB lead 78, there is provided a support member 54₅ to support the leads B and C.

The structure of the TAB lead 78 having the tiered leads A, B and C establishes a low resistance and a large current capacity in a signal path because of the three conductive leads in parallel. This is useful in transmitting a large current such as in a ground line or a power line of a probe card for testing a semiconductor device with high speed without deforming the waveforms of test signals.

Figure 27:
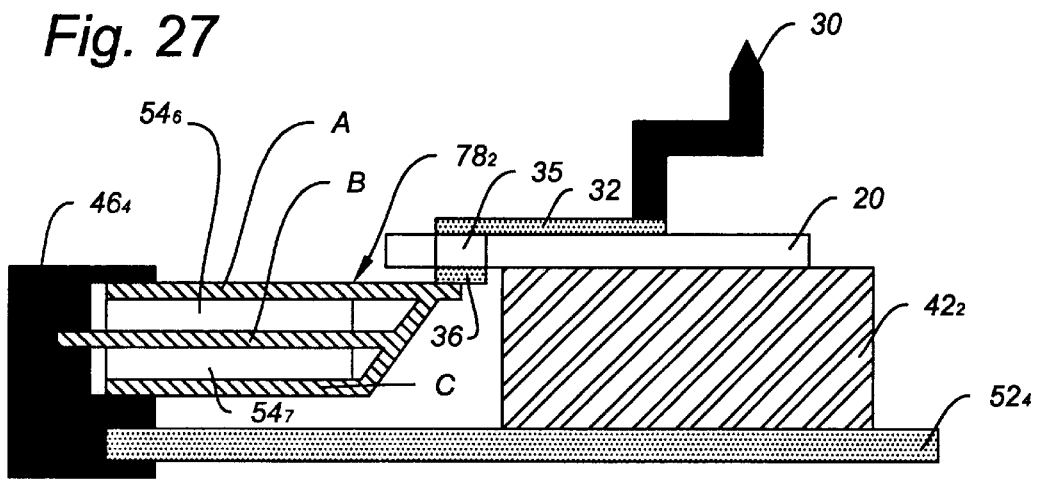
FIG. 27 is a schematic diagram showing a further modified structure of the fifth embodiment of the present invention in which a contact target is a connector to be connected with the straight shape triple layer TAB lead.

FIG. 27 shows a further modification of the fifth embodiment of the present invention wherein the bottom type contact pad 36 is coupled to a connection target such as a connector provided on a printed circuit board or other structure. In the example of FIG. 27, a contact pad 36 provided at the bottom surface of the contact substrate 20 is connected to a connector 46₄ via a triple layer TAB lead 78₂. The triple layer TAB 78₂ has an upper lead A, an intermediate lead B and a lower lead C each of which is separated at the end. The connector 46₄ is provided on a support structure 52₄.

The connector 46₄ may be mechanically fixed to the support structure 52₄ through an attachment mechanism (not shown). The ends of the leads A, B and C of the TAB lead 78₂ are inserted in receptacles (not shown) of the connector 46₄. As is well known in the art, such a receptacle has a spring mechanism to provide a sufficient contact force when receiving the end of the TAB lead 78₂ therein. A support member 54₆ is provided between the upper lead A and the intermediate lead B and a support member 54₇ is provided between the intermediate lead B and the lower lead C of the triple TAB lead 78₂.

The structure of the TAB lead 78₂ having the triple layered leads A, B and C establishes a fan out in the vertical dimension of the TAB lead. This is useful in distributing a signal or power to two or more paths. Another advantage of the fan out is to increase the number of contact pads, i.e., to decrease the effective pitch (distance) between the contact pads.

Figure 28:
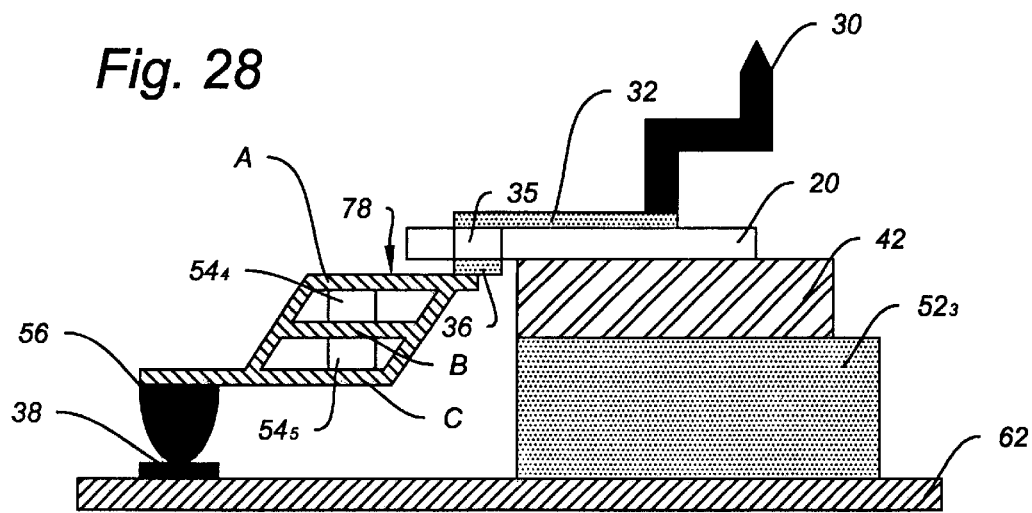
FIG. 28 is a schematic diagram showing a further modified structure of the fifth embodiment of the present invention in which a conductive bump is incorporated between the TAB lead and the contact target as one of interconnection and packaging members.

FIG. 28 shows a further example of the fifth embodiment of the present invention wherein the bottom type contact pad is coupled to a connection target such as an interconnect pad provided on a printed circuit board through a conductive bump. In the example of FIG. 28, a contact structure 30, a contact trace 32, a through hole 35 and a contact pad 36 are formed on a contact substrate 20. The contact structure 30 is formed on the upper surface of the contact substrate 20 while the contact pad 36 is formed on the bottom surface of the substrate 20. Typically, the contact substrate 20 is a silicon substrate although other types of dielectric substrate, such as glass epoxy, polyimide, ceramic, and alumina substrates are also feasible. The contact pad 36 is connected to a PCB (print circuit board) pad 38 provided on a PCB substrate 62 through a conductive bump 56 via a triple layer TAB lead 78.

The contact substrate 20 is mounted on the PCB substrate 62 through a support structure 52₃ and an elastomer 42. The contact substrate 20, the elastomer 42, the support structure 52₃, and the PCB substrate 62 are attached with one another by, for example, applying an adhesive (not shown). Between the upper lead A and the intermediate lead B of the triple layer TAB lead 78, there is provided a support member 54₄ to support the leads A and B. Between the intermediate lead B and the lower lead C of the triple layer TAB lead 78, there is provided a support member 54₅ to support the leads B and C.

The structure of the TAB lead 78 having the tiered leads A, B and C establishes a low resistance and a large current capacity in a signal path because of the three conductive leads running in parallel. This is useful in transmitting a large current such as in a ground line or a power line in a probe card for testing a semiconductor device with high speed without deforming the waveforms of test signals.

By the application of the heat, the conductive bump 56 is reflowed onto the PCB pad 38 for attachment between the TAB lead 78 and the PCB pad 38. An example of the conductive bump 56 is a solder bump used in a standard solder ball technology. Another example of the conductive bump 56 is a fluxless solder ball used in a plasma-assisted dry soldering technology.

Figure 29:
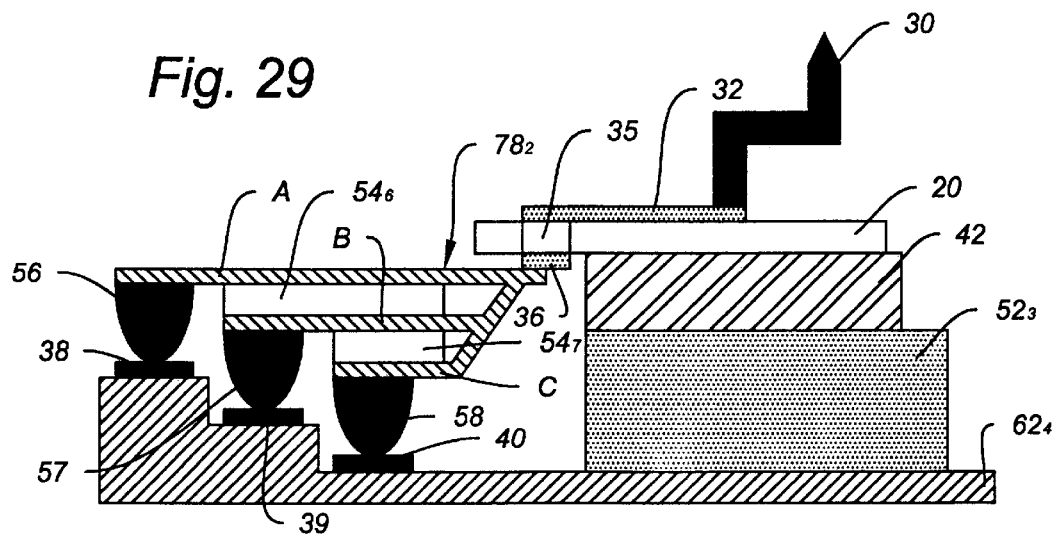
FIG. 29 is a schematic diagram showing a further modified structure of the fifth embodiment of the present invention in which three conductive bumps are incorporated between the triple layer TAB lead and the contact targets as interconnection and packaging members.

FIG. 29 shows another example of the fifth embodiment of the present invention. In this example, a triple layered TAB lead 78₂ having upper, intermediate and lower leads A, B and C is provided to the contact pad 36 connected to the contact structure 30. The upper lead A is provided in an upper and outer position of FIG. 29 than the intermediate lead B. The intermediate lead B is provided in an upper and outer position than the lower lead C in FIG. 29. The upper lead A is connected to a PCB pad 38 through a conductive bump 56, the intermediate lead B is connected to a PCB pad 39 through a conductive bump 57, and the lower lead C is connected to a PCB pad 40 through a conductive bump 58. To accommodate the PCB pads 38, 39 and 40 thereon, a PCB substrate 62₄ is arranged to have steps to mount the PCB pads 38, 39 and 40 with different vertical positions. A support member 54₆ is provided between the upper lead A and the intermediate lead B and a support member 54₇ is provided between the intermediate lead B and the lower lead C.

By the application of the heat, the conductive bumps 56, 57 and 58 are reflowed onto the PCB pads 38, 39 and 40 for attachment between the TAB lead 78₂ and the PCB pads 38, 39 and 40. An example of the conductive bumps 56, 57 and 58 is a solder bump used in a standard solder ball technology. Another example of the conductive bumps 56, 57 and 58 is a fluxless solder ball used in a plasma-assisted dry soldering technology.

The structure of the TAB lead 78₂ having the triple layered leads A, B and C establishes a fan out in the vertical dimension of the TAB lead. This is useful in distributing a signal or power to two or more paths. Another advantage of the fan out is to increase the number of contact pads, i.e., to decrease the effective pitch (distance) between the contact pads.

FIG. 30 shows a further example of the fifth embodiment of the present invention wherein the bottom type contact pad is coupled to an interconnect pad provided on a printed circuit board through a conductive polymer. In the example of FIG. 30, a contact structure 30, a contact trace 32, a through hole and a contact pad 36 are formed on a contact substrate 20. The contact structure 30 is formed on the upper surface of the contact substrate 20 while the contact pad 36 is formed on the bottom surface of the substrate 20.

Typically, the contact substrate 20 is a silicon substrate although other types of dielectric substrate, such as glass epoxy, polyimide, ceramic, and alumina substrates are also feasible. The contact pad 36 is connected to a contact target such as a PCB (printed circuit board) pad 38 provided on a PCB substrate 62 through a conductive polymer 66 via a triple layer TAB lead 78.

The contact substrate 20 is mounted on the PCB substrate 62 through a support structure $52_3$ and an elastomer 42. The contact substrate 20, the elastomer 42, the support structure $52_3$, and the PCB substrate 62 are attached with one another by, for example, an adhesive (not shown). Between the upper lead A and the intermediate lead B of the double layer TAB lead 78, there is provided a support member $54_4$ to support the leads A and B. Between the intermediate lead B and the lower lead C of the double layer TAB lead 78, there is provided a support member $54_5$ to support the leads B and C.

Most conductive polymers are designed to be conductive between the mating electrodes normally in vertical of angled directions and not conductive in the horizontal direction. An example of the conductive polymer 66 is a conductive elastomer which is filled with conductive wire that extends beyond the surface of the elastomer.

Various other examples of the conductive polymer 66 are possible such as an anisotropic conductive adhesive, anisotropic conductive film, anisotropic conductive paste, and anisotropic conductive particles. The anisotropic conductive adhesive is filled with conductive particles that do not touch each other. The conductive path is formed by pressing the adhesive between the two electrodes at a specific location. The anisotropic conductive film is a thin dielectric resin filled with conductive particles that do not touch each other. The conductive path is formed by pressing the film between the two electrodes at a specific location.

The anisotropic conductive paste is a screen printable paste which is filled with conductive particles that do not touch each other. The conductive path is formed by pressing the paste between the two electrodes at a specific location. The anisotropic conductive particle is a thin dielectric resin filled with conductive particles coated with a very thin layer of dielectric material to improve isolation. The conductive path is formed by pressing the particle with enough force to explode the dielectric coating on the particles, between the two electrodes at a specific location.

The structure of the TAB lead 78 having the tiered leads A, B and C establish a low resistance and a large current capacity in a signal path because of the three conductive leads. This is useful in transmitting a large current such as in a ground line or a power line for testing a semiconductor device with high speed without deforming the waveforms of test signals.

FIG. 31 shows another example of the fifth embodiment of the present invention. In this example, a triple layered TAB lead $78_2$ having upper, intermediate and lower leads A, B and C is provided to the contact pad 36 connected to the contact trace 32 and contact structure 30. The upper lead A is provided in an upper and outer position than the intermediate lead B in FIG. 31. The intermediate lead B is provided in an upper and outer position of FIG. 31 than the lower lead C. The upper lead A is connected to a PCB pad 38 through a conductive polymer 66, the intermediate lead B is connected to a PCB pad 39 through a conductive polymer 67, and the lower lead C is connected to a PCB pad 40 through a conductive polymer 68. To accommodate the PCB pads 38, 39 and 40 thereon, a PCB substrate $62_4$ is arranged to have steps to mount the PCB pads 38, 39 and 40 with different vertical positions. A support member $54_6$ is provided between the upper lead A and the intermediate lead B and a support member $54_7$ is provided between the intermediate lead B and the lower lead C.

The structure of the TAB lead $78_2$ having the triple layered leads A, B and C establishes a fan out in the vertical dimension of the TAB lead. This is useful in distributing a signal or power to two or more paths. Another advantage of the fan out is to increase the number of contact pads, i.e., to decrease the effective pitch (distance) between the contact pads.

Figure 32:
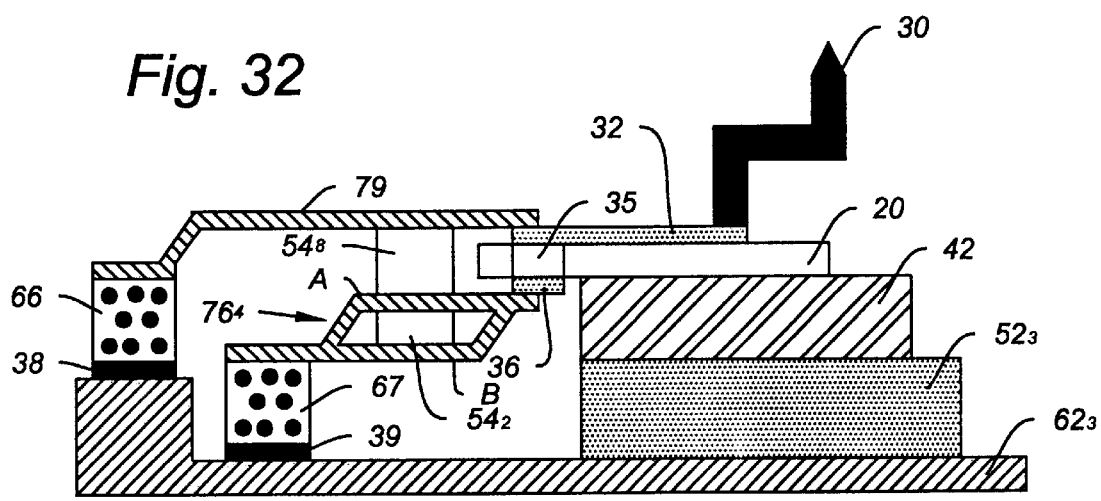
FIG. 32 is a schematic diagram showing a sixth embodiment of the present invention in which the packaging and interconnection is established by a single layer TAB (tape automated bonding) lead between a contact trace provided at an upper surface of the contact substrate and a first contact target as well as a double layer TAB lead between a contact pad provided at a bottom surface of the contact substrate and a second contact target.

FIG. 32 shows a sixth embodiment of the present invention wherein a top contact trace is coupled to a first contact target through a single layer TAB lead while a bottom type contact pad is coupled to a second contact target through a double layer TAB lead. In the example of FIG. 32, the contact structure 30 formed on a contact substrate 20 is electrically connected to the contact pad 36 via the contact trace 32 and the through hole 35. The contact structure 30 and the contact trace 32 are formed on the upper surface of the contact substrate 20 while the contact pad 36 is formed on the bottom surface of the substrate 20.

The contact trace 32 is connected at its upper surface to a single layer TAB lead 79 whose other end is connected to a printed circuit board (PCB) pad 38 on a PCB substrate 623 through a conductive polymer 66. The contact pad 36 is connected at its bottom surface with a two layer TAB lead $76_4$ whose other end is connected to a PCB pad 39 on the PCB substrate $62_3$ through a conductive polymer 67.

The contact substrate 20 is mounted on the PCB substrate $62_3$ through an elastomer 42 and a support structure $52_3$. The contact substrate 20, the elastomer 42, the support structure $52_3$ and the PCB substrate 62 are fixed with one another by, for example, an adhesive (not shown). In this example, the single layer TAB lead 79 for connecting the contact trace 32 and the contact pad 38 is supported by a support member $54_8$ which is provided between the TAB leads 79 and $76_4$. The double layered TAB lead $76_4$ for connecting the contact pad 36 and the PCB pad 39 has an upper lead A and a lower lead B. A support member $54_2$ is provided between the upper lead A and the lower lead B of the double layered TAB lead $76_4$. In this embodiment, the conductive polymer 66 and 67 can be replaced with conductive bumps such as solder balls for connecting the contact structure to the PCB pads 38 and 39. Alternatively, the TAB leads 79 and $76_4$ can be directly connected to the PCB pads 38 and 39.

The structure of the TAB lead 79 having the single lead and the TAB lead $76_4$ having the tiered leads A and B establishes a low resistance and a large current capacity in a signal path because of the three conductive leads running in parallel. This is useful in transmitting a large current such as in a ground line or a power line in a probe card for testing a semiconductor device with high speed without deforming the waveforms of test signals. The structure of TAB leads in FIG. 32 also achieves flexibility in increasing the number of contact pads.

According to the present invention, the packaging and interconnection has a very high frequency bandwidth to meet the test requirements in the next generation semiconductor technology. The packaging and interconnection is able to mount the contact structure on a probe card or equivalent thereof by electrically connecting therewith from the bottom of the contact substrate mounting the contact structure. Moreover, because of a relatively small number of overall components to be assembled, the interconnection and packaging of the present invention can be fabricated with low cost and high reliability as well as high productivity.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A packaging and interconnection of a contact structure, comprising:

a contact structure made of conductive material and formed on a contact substrate, said contact structure having a base portion vertically formed on the contact substrate, a horizontal portion one end of which is formed on said base portion, and a contact portion vertically formed on another end of said horizontal portion;

a contact trace formed on an upper surface of the contact substrate and electrically connected to the contact structure at one end and horizontally extended on the upper surface to be substantially remote from the contact structure at other end;

a contact pad formed on a bottom surface of the contact substrate substantially horizontally remote from the contact structure and electrically connected to the contact structure through a via hole and said other end of the contact trace;

a connection target provided at an outer periphery of the contact structure in a side-by-side fashion with the contact structure to be electrically connected with the contact pad on the contact substrate; and a double layer lead having at least a portion where a conductive lead thereof is separated into two for electrically connecting the contact pad provided at the bottom surface of the contact substrate and the connection target.

2. A packaging and interconnection of a contact structure as defined in claim 1, further comprising:

an elastomer provided under said contact substrate for allowing flexibility in said interconnection and packaging; and a support structure provided between said elastomer and said connection target for supporting said contact structure, said contact substrate and said elastomer.

3. A packaging and interconnection of a contact structure as defined in claim 1, wherein said connection target is a multilayer printed circuit board (PCB) substrate made of glass epoxy resin or ceramic.

4. A packaging and interconnection of a contact structure as defined in claim 2, wherein said support structure is made of ceramic, molded plastic or metal.

5. A packaging and interconnection of a contact structure as defined in claim 1, wherein said double layer lead is formed in a tape automated bonding (TAB) structure.

6. A packaging and interconnection of a contact structure as defined in claim 1, wherein one end of said double layer lead is connected to said connection target through a conductive bump.

7. A packaging and interconnection of a contact structure as defined in claim 6, wherein said conductive bump is a solder ball which reflows when heat is applied thereto to electrically connect said other end of said double layer lead and said connection target.

8. A packaging and interconnection of a contact structure as defined in claim 6, wherein said conductive bump is a conductive polymer bump or a compliant bump to electrically connect said other end of said double layer lead and said connection target.

9. A packaging and interconnection of a contact structure as defined in claim 1, wherein one end of said double layer lead is connected to said connection target through a conductive polymer.

10. A packaging and interconnection of a contact structure as defined in claim 9, wherein said conductive polymer is made of a conductive adhesive, a conductive film, conductive paste or conductive particles.

11. A packaging and interconnection of a contact structure as defined in claim 9, wherein said conductive polymer is a conductive elastomer including an anisotropic conductive adhesive, anisotropic conductive film, anisotropic conductive paste or anisotropic conductive particles to electrically connect said end of said double layer lead to said connection target.

12. A packaging and interconnection of a contact structure as defined in claim 1, wherein one end of said double layer lead is formed of an upper lead and a lower lead to be respectively connected to corresponding connection pads provided on said connection target.

13. A packaging and interconnection of a contact structure as defined in claim 12, wherein said upper lead and said lower lead are respectively connected to said corresponding connection pads provided on said connection target through corresponding conductive bumps.

14. A packaging and interconnection of a contact structure as defined in claim 12, wherein said upper lead and said lower lead are respectively connected to said corresponding connection pads provided on said connection target through corresponding conductive polymers.

* * * * *